United States Patent
Yoshida et al.

(10) Patent No.: US 7,907,076 B2
(45) Date of Patent: Mar. 15, 2011

(54) DIFFERENTIAL AMPLIFIER CIRCUIT AMPLIFYING DIFFERENTIAL SIGNALS WITH SELECTIVELY SWITCHING BETWEEN DIFFERENTIAL SIGNALS AND AD CONVERTER APPARATUS

(75) Inventors: Takeshi Yoshida, Hiroshima (JP); Yoshihiro Masui, Hiroshima (JP); Atsushi Iwata, Hiroshima (JP); Kunihiko Gotoh, Kanagawa (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 12/582,305

(22) Filed: Oct. 20, 2009

(65) Prior Publication Data

US 2010/0103015 A1    Apr. 29, 2010

(30) Foreign Application Priority Data

Oct. 20, 2008 (JP) ................ 2008-269814

(51) Int. Cl.
*H03M 1/34* (2006.01)
(52) U.S. Cl. .............. 341/158; 341/143; 341/155
(58) Field of Classification Search ............ 341/143, 341/155
See application file for complete search history.

(56) References Cited

U.S. PATENT DOCUMENTS

| | | | | |
|---|---|---|---|---|
| 5,030,954 | A * | 7/1991 | Ribner | 341/143 |
| 5,068,659 | A * | 11/1991 | Sakaguchi | 341/143 |
| 5,323,158 | A * | 6/1994 | Ferguson, Jr. | 341/143 |
| 7,015,841 | B2 | 3/2006 | Yoshida et al. | |
| 7,098,827 | B2 * | 8/2006 | Motz | 341/143 |
| 7,248,200 | B2 | 7/2007 | Komuro et al. | |
| 7,301,399 | B2 | 11/2007 | Yoshida et al. | |
| 7,336,123 | B2 | 2/2008 | Yoshida et al. | |
| 7,538,705 | B2 * | 5/2009 | Deval et al. | 341/143 |
| 7,551,110 | B1 * | 6/2009 | Tsyrganovich | 341/143 |

(Continued)

FOREIGN PATENT DOCUMENTS

JP    2005-223888    8/2005

(Continued)

OTHER PUBLICATIONS

Takanori Komuro et al. "*ADC Architecture Using Time-to-Digital Converter*", Technical Papers C of the Institute of Electronics, Information and Communication Engineers, vol. J90-C, No. 2, pp. 125-133, issued by The Institute of Electronics, Information and Communication Engineers, Feb. 2007.

(Continued)

*Primary Examiner* — Khai M Nguyen
(74) *Attorney, Agent, or Firm* — Wenderoth, Lind & Ponack, L.L.P.

(57) ABSTRACT

A differential amplifier circuit is provided with an operational amplifier and a modulator. The operational amplifier includes a feedback capacitance, and amplifies an analog input signal and outputs an amplified analog output signal. The modulator is connected to a virtual ground point of an input terminal of the operational amplifier, and the modulator switches between a pair of inputted analog differential signals to alternately select one of the analog differential signals based on a predetermined modulation control signal, and outputs a selected analog differential signal. The differential amplifier circuit alternately folds and amplifies the analog input signal within a predetermined input level limit range to generate a signal having different polarities sequentially so as to start from a voltage potential of the virtual ground point at a timing of the modulation control signal. In addition, an converter apparatus is provided with the differential amplifier circuit.

9 Claims, 14 Drawing Sheets

U.S. PATENT DOCUMENTS 7,589,587 B2 * 9/2009 Yoshida et al. .................. 330/9

FOREIGN PATENT DOCUMENTS

| JP | 2006-157262 | 6/2006 |
|---|---|---|
| JP | 2006-279377 | 10/2006 |
| JP | 2006-304035 | 11/2006 |
| JP | 2008-67050 | 3/2008 |

OTHER PUBLICATIONS

Yoshikazu Nitta et al., "*High-Speed Digital Double Sampling with Analog CDS on Column Parallel ADC Architecture for Low-Noise Active Pixel Sensor*", Proceedings of 2006 IEEE International Solid-State Circuits Conference (ISSCC 2006), Session 27, Image Sensors, 27.5, pp. 500-501, in San Francisco, U.S.A., Feb. 5-9, 2006.

Y. Arai et al. "*A CMOS Time to Digital Converter VLSI for High-Energy Physics*", Digest of Technical papers of 1988 Symposium on VLSI Circuits, in Tokyo, Japan XI-3, pp. 121-122, Aug. 1988.

M. Lee et al., "*A 9b, 1.25ps Resolution Coarse-Fine Time-to-Digital Converter in 90nm CMOS that Amplifies a Time Residue*", Digest of Technical papers of 2007 Symposium and VLSI Circuits, in Kyoto, Japan, No. 16-4, pp. 168-169, Jun. 2007.

T. Yoshida et al., "*A 1V Low-Noise CMOS Amplifier Using Autozeroing and Chopper Stabilization Technique*", IEICE Transactions on Electrons, The Institute of Electronics, Information and Communication Engineers (IEICE), vol. E89-C, pp. 769-774, Jun. 2006.

\* cited by examiner

US 7,907,076 B2

DIFFERENTIAL AMPLIFIER CIRCUIT AMPLIFYING DIFFERENTIAL SIGNALS WITH SELECTIVELY SWITCHING BETWEEN DIFFERENTIAL SIGNALS AND AD CONVERTER APPARATUS

BACKGROUND OF THE INVENTION

1. Field of the Invention

The present invention relates to a differential amplifier circuit (delta amplifier) that is an analog circuit to be formed on, for example, an LSI (Large Scaled Integrated Circuit) and amplifies a pair of differential signals with selectively switching between the differential signals, and an AD converter apparatus that uses the same. Hereinafter, an analog to time conversion will be referred to as "an AT conversion", an analog to digital conversion will be referred to as "an AD conversion", and a time to digital conversion will be referred to as "a TD conversion". In addition, an analog via time to digital conversion will be referred to as "an ATD conversion".

2. Description of the Related Art

As a semiconductor process becomes finer, a high-accuracy analog circuit becomes difficult to be realized due to such problems as reduction of a power supply voltage in an analog circuit, deterioration of linearity, deterioration of a signal-to-noise power ratio (hereinafter, referred to as an SNR), and deterioration of a dynamic range. In order to solve these problems, there has been proposed an AD converter that employs a TD converter for measuring an input signal in a time domain (hereinafter, referred to as a first conventional example) (e.g., See Patent Document 1 and Non-Patent Document 1).

According to the first conventional example, the AD converter that employs the TD converter is configured to include a track hold circuit, a comparator, and the TD converter. The comparator compares an input signal with a sinusoidal wave signal serving as a reference signal, and outputs a timing when the input signal is coincident with the reference signal. The TD converter converts the timing (time) data into a digital value. If the reference signal has been already known, an input signal voltage can be fixed based on the timing data, and this leads to realization of AD conversion. In addition, the TD converter is configured to include a digital circuit, and therefore, it benefits from the fine process. Thus, the TD converter can process information in a time domain with higher resolution and higher accuracy even under a low power supply voltage.

In addition, as disclosed in Non-Patent Document 2, an integrating type AD converter according to a second conventional example is characterized in that a comparator receives a ramp wave of an input signal and a ramp wave of a reference signal to detect a timing when the input signal is coincident with the reference signal, and a counter measures the timing (time) data.

Documents related to the present invention are as follows:

Patent Document 1: Japanese Patent Laid-open Publication No. JP-2006-304035-A.
Patent Document 2: Japanese Patent Laid-open Publication No. JP-2005-223888-A.
Patent Document 3: Japanese Patent Laid-open Publication No. JP-2006-157262-A.
Patent Document 4: Japanese Patent Laid-open Publication No. JP-2006-279377-A.
Patent Document 5: Japanese Patent Laid-open Publication No. JP-2008-067050-A.
Non-Patent Document 1: Takanori Komuro et al., "ADC Architecture Using Time-to-Digital Converter", Technical Papers C of The Institute of Electronics, Information and Communication Engineers, Vol. J90-C, No. 2, pp. 125-133, issued by The Institute of Electronics, Information and Communication Engineers, February 2007.
Non-Patent Document 2: Yoshikazu Nitta et al., "High-Speed Digital Double Sampling with Analog CDS on Column Parallel ADC Architecture for Low-Noise Active Pixel Sensor", Proceedings of 2006 IEEE International Solid-State Circuits Conference (ISSCC 2006), Session 27, Image Sensors, 27.5, pp. 500-501, in San Francisco, U.S.A., Feb. 5-9, 2006.
Non-Patent Document 3: Y. Arai et al., "A CMOS Time to Digital Converter VLSI for High-Energy Physics", Digest of Technical papers of 1988 Symposium on VLSI Circuits, in Tokyo, Japan, XI-3, pp. 121-122, August 1988.
Non-Patent Document 4: M. Lee et al., "A 9b, 1.25 ps Resolution Coarse-Fine Time-to-Digital Converter in 90 nm CMOS that Amplifies a Time Residue", Digest of Technical papers of 2007 Symposium on VLSI Circuits, in Kyoto, Japan, No. 16-4, pp. 168-169, June 2007.
Non-Patent Document 5: T. Yoshida et al., "A 1V Low-Noise CMOS Amplifier Using Autozeroing and Chopper Stabilization Technique", IEICE Transactions on Electrons, The Institute of Electronics, Information and Communication Engineers (IEICE), Vol. E89-C, pp. 769-774, June 2006.

According to the first conventional example, the AD converter that employs the TD converter requires a high-accuracy sinusoidal wave signal generator for generating a reference signal. In addition, the AD converter has an input full-scale range which is equal to or less than a power supply voltage. Consequently, there arises such a problem that the circuit becomes poor in SNR and dynamic range if the power supply voltage is reduced because the semiconductor process becomes finer.

In addition, according to the second conventional example, the integrating type AD converter has an input full-scale range which is equal to or less than a power supply voltage. Consequently, the circuit becomes poor in linearity and dynamic range. When the AD converter is realized in an LSI, a ramp signal generator for generating a reference signal is less prone to be formed with higher accuracy, resulting in such a problem that a conversion rate becomes very slow (e.g., several milliseconds).

SUMMARY OF THE INVENTION

A first object of the present invention is to solve the problems described above and to provide a differential amplifier circuit that allows improvement in the SNR and dynamic range as compared with those of the prior art.

In addition, a second object of the present invention is to solve the problems described above and to provide an AD converter apparatus that can operate at higher rate with higher accuracy as compared with that of the prior art, using the differential amplifier circuit.

In order to achieve the aforementioned objective, according to one aspect of the present invention, there is provided a differential amplifier circuit including an operational amplifier, and a modulator. The operational amplifier includes a feedback capacitance, and amplifier amplifies an analog input signal and outputting an amplified analog output signal. The modulator is connected to a virtual ground point of an input terminal of the operational amplifier, and the modulator switches between a pair of inputted analog differential signals to alternately select one of the analog differential signals based on a predetermined modulation control signal, and outputs a selected analog differential signal. The differential amplifier circuit alternately folds and amplifies the analog input signal within a predetermined input level limit range to generate a signal having different polarities sequentially so as to start from a voltage potential of the virtual ground point at a timing of the modulation control signal.

According to another aspect of the present invention, there is provided an AD converter apparatus including the above-mentioned differential amplifier circuit. The AD converter apparatus further includes an AD converter and a digital demodulator. The AD converter AD-converts the analog output signal from the operational amplifier into a digital signal, and the digital demodulator inverts a polarity of the digital signal from the AD converter at the timing of the modulation control signal, offsets the polarity at the virtual ground point, and adds the digital signal to a signal level of a digital signal at a preceding timing to demodulate the digital signal corresponding to a signal level of the analog input signal.

According to a further aspect of the present invention, there is provided an AD converter apparatus including the above-mentioned differential amplifier circuit. The AD converter apparatus further includes a comparator, a modulation controller, a. TD converter, and a digital demodulator. The comparator compares the analog output signal from the operational amplifier with a predetermined reference value, and outputs a comparison result signal. The modulation controller generates and outputs an AT conversion signal representing a timing of change in the comparison result signal from the comparator, outputs the AT conversion signal to the modulator as a modulation control signal, and generates and outputting a demodulation increasing and decreasing control signal that changes in accordance with increasing and decreasing of the analog input signal for demodulation of the analog input signal. The TD converter converts the AT conversion signal from the modulation controller into a TD conversion signal, which is a digital signal, at a timing of a predetermined data clock. The digital demodulator demodulates the TD conversion signal from the TD converter into a digital AD conversion demodulation signal having a signal level corresponding to the analog input signal, using the data clock and the demodulation increasing and decreasing control signal.

In the above-mentioned AD converter apparatus, the comparator compares the analog output signal from the operational amplifier with a predetermined maximum reference value and a predetermined minimum reference value and outputs a comparison result signal.

In addition, in the above-mentioned AD converter apparatus, the comparator further compares the analog output signal from the operational amplifier with a plurality of reference values allocated between the maximum reference value and the minimum reference value, and outputs an intermediate comparison result signal between the maximum reference value and the minimum reference value. The TD converter further converts the intermediate comparison result signal from the comparator into an intermediate comparison result signal, which is a digital signal, at the timing of the data clock. The digital demodulator demodulates the TD conversion signal from the TD converter into a digital AD conversion demodulation signal having a signal level corresponding to the analog input signal, using the data clock, the demodulation increasing and decreasing control signal, and the intermediate comparison result signal.

Further, in the above-mentioned AD converter apparatus, each of the differential amplifier circuit and the AD converter is configured by a fully-differential circuit.

Still further, in the above-mentioned AD converter apparatus, each of the differential amplifier circuit and the comparator is configured by a fully-differential circuit.

Accordingly, the differential amplifier circuit according to the present invention and the AD converter apparatus using the same differential amplifier circuit allow provision of a differential amplifier circuit that allows improvement in the SNR and dynamic range as compared with those of the prior art and provision of an AD converter apparatus that can operate at higher rate with higher accuracy as compared with that of the prior art, using the differential amplifier circuit. In particular, the differential amplifier circuit according to the present invention and the AD converter apparatus using the same differential amplifier circuit have the following unique functions and advantageous effects.

(1) The differential amplifier circuit is configured to include the operational amplifier that is provided with the feedback capacitance circuit and has the virtual ground point into which the modulator circuit is inserted. Therefore, the differential amplifier circuit can operate at a low voltage. As the process becomes finer, the AD converter, which is configured to include the digital circuit and is provided at a subsequent stage of the differential amplifier circuit, operates at higher rate, and this leads to remarkable improvement in the SNR of the entire AD converter apparatus.

(2) The multi-bit operation by the comparator allows increase of the voltage resolution between reference voltage potentials, i.e., the voltage resolution of the AD converter, and this leads to remarkable improvement in the SNR of the AD converter apparatus.

(3) The reference voltages of the comparator allow free setting of the output amplitude range in the operational amplifier, and this leads to alleviation of requirement for linearity specifications for the output signal.

(4) In the operational amplifier, the output waveform is folded within a range of the reference voltages. Therefore, the operational amplifier can output a signal having a voltage amplitude which is larger than the power supply voltage, upon demodulation in the digital domain. Accordingly, the circuit can be remarkably improved in the output dynamic range.

(5) In the operational amplifier, the signal amplitude at the virtual ground point is compressed to (1/Gain) of the original signal amplitude. Therefore, the operational amplifier can receive a signal amplitude which is equal to or larger than the power supply voltage. Thus, the circuit does not require any level shift circuit or any attenuator in the circuit input part, and this leads to simplification of the circuit configuration.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 2(a) is a signal waveform chart of analog signals Vin+ and Vin− inputted to a differential amplifier circuit 1 of FIG. 1, FIG. 2(b) is a signal waveform chart of a modulation control signal inputted to the differential amplifier circuit 1 of FIG. 1, FIG. 2(c) is a signal waveform chart of an output signal DeltAMPout from the differential amplifier circuit 1 of FIG. 1, FIG. 2(d) is a signal waveform chart of an operation clock inputted to an AD converter 3 of FIG. 1, FIG. 2(e) is a signal waveform chart of an AD conversion signal ADCout from the AD converter 3, FIG. 2(f) is a signal waveform chart of a demodulation control signal inputted to a digital demodulator circuit 4 of FIG. 1, and FIG. 2(g) is a signal waveform chart of an AD conversion demodulation signal ADDout from the digital demodulator circuit 4 of FIG. 1;

FIG. 5(a) is a signal waveform chart of analog signals Vin+ and Vin− inputted to a differential amplifier circuit 1 of FIG. 3, FIG. 5(b) is a signal waveform chart of an output signal DeltAMPout from the differential amplifier circuit 1 of FIG. 3, FIG. 5(c) is a signal waveform chart of an output signal Compout2 from a comparator circuit 21-2 of FIG. 3, FIG. 5(d) is a signal waveform chart of an output signal Compout1 from a comparator circuit 21-1 of FIG. 3, FIG. 5(e) is a signal waveform chart of an AT conversion signal ATCout and a modulation control signal from the modulation control circuit 22 of FIG. 3, FIG. 5(f) is a signal waveform chart of a demodulation increasing and decreasing control signal inputted to a digital demodulator circuit 32 from the modulation control circuit 22 of FIG. 3, FIG. 5(g) is a signal waveform chart of a TD conversion signal TDCout from a TD converter 31 of FIG. 3, and FIG. 5(h) is a signal waveform chart of an AD conversion demodulation signal ADDout from the digital demodulator circuit 32 of FIG. 3;

FIG. 7(a) is a signal waveform chart of analog signals Vin+ and Vin− inputted to a differential amplifier circuit 1 of FIG. 6, FIG. 7(b) is a signal waveform chart of an output signal DeltAMPout from the differential amplifier circuit 1 of FIG. 6, FIG. 7(c) is a signal waveform chart of an output signal Compout2 from a comparator circuit 21-2 of FIG. 6, FIG. 7(d) is a signal waveform chart of an output signal Compout1 from a comparator circuit 21-1 of FIG. 6, FIG. 7(e) is a signal waveform chart of an output signal Compoutmn from a comparator circuit 23-n (n=1, 2, . . . , N) of FIG. 6, FIG. 7(f) is a signal waveform chart of an AT conversion signal ATCout and a modulation control signal from a modulation control circuit 22 of FIG. 6, FIG. 7(g) is a signal waveform chart of a demodulation increasing and decreasing control signal from the modulation control circuit 22 of FIG. 6, FIG. 7(h) is a signal waveform chart of a TD conversion signal TDCout from a TD converter 31M of FIG. 6, FIG. 7(i) is a signal waveform chart of a multi-bit comparison result signal TDCoutmn from the TD converter 31M of FIG. 6, and FIG. 7(j) is a signal waveform chart of an AD conversion demodulation signal ADDout from a digital demodulator circuit 32M of FIG. 6;

DETAILED DESCRIPTION OF THE PREFERRED EMBODIMENTS

With reference to the drawings, hereinafter, description will be given of preferred embodiments of the present invention. It is to be noted that identical reference symbols designate similar constituent elements in the respective preferred embodiments to be described below.

First Preferred Embodiment

Figure 1:
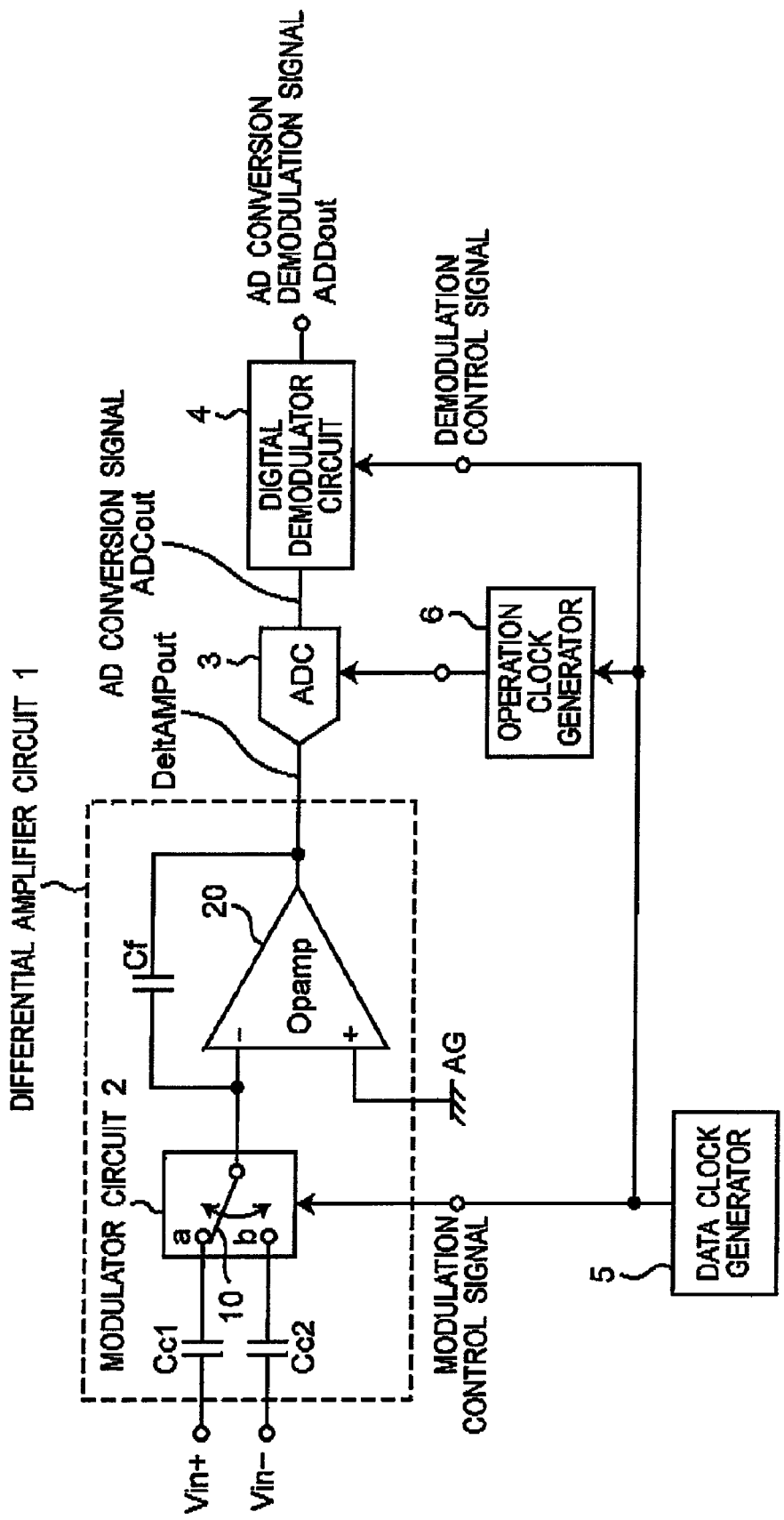
FIG. 1 is a block diagram showing a configuration of an AD converter apparatus according to a first preferred embodiment of the present invention.
Figure 2:
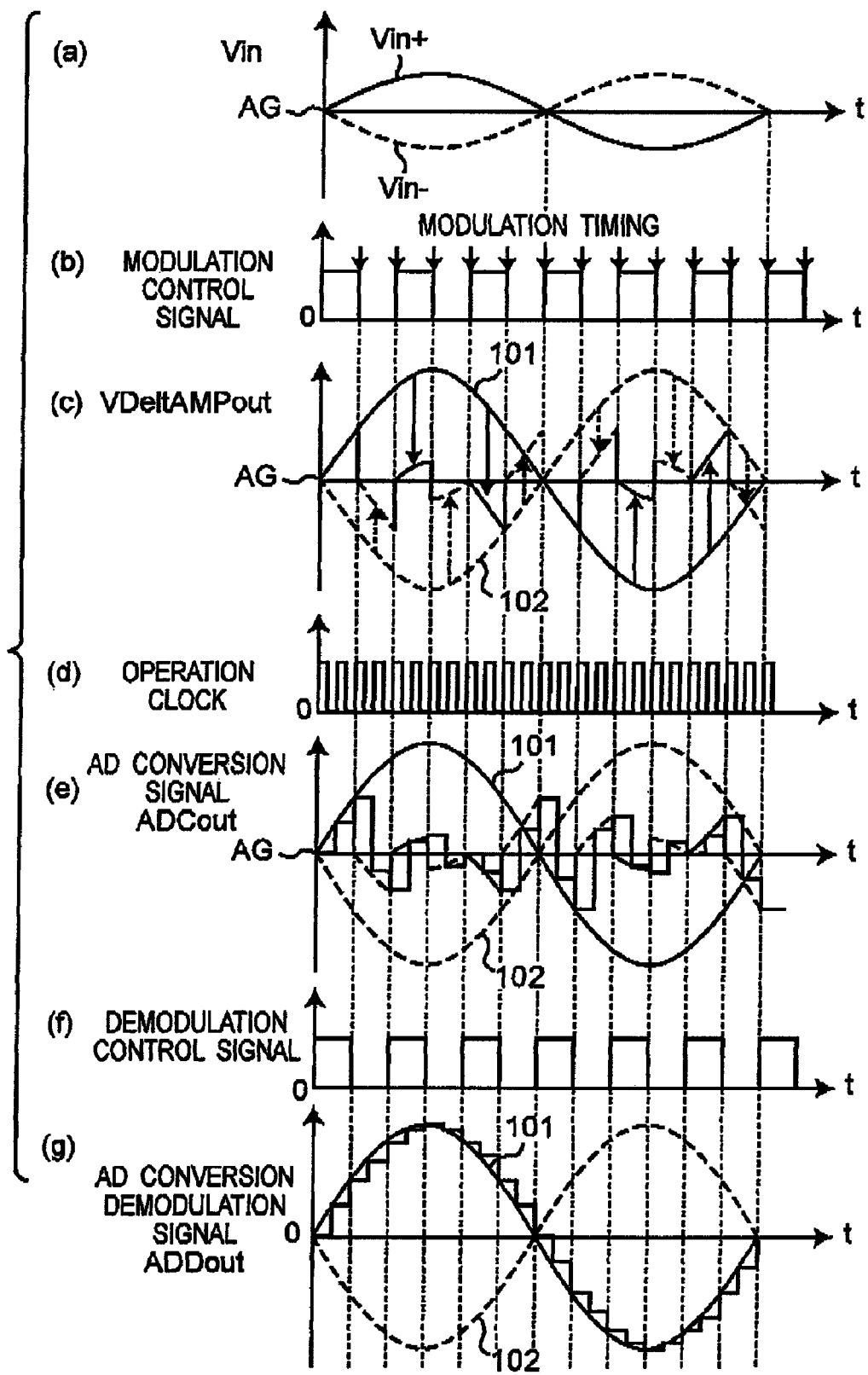
FIG. 2 shows signal waveform charts of signals representing operations of the AD converter apparatus of FIG. 1.

FIG. 1 is a block diagram showing a configuration of an AD converter apparatus according to a first preferred embodiment of the present invention. In addition, FIG. 2 shows signal waveform charts of signals representing operations of the AD converter apparatus of FIG. 1. More specifically, FIG. 2(a) is a signal waveform chart of analog signals Vin+ and Vin− inputted to a differential amplifier circuit 1 of FIG. 1. FIG. 2(b) is a signal waveform chart of a modulation control signal inputted to the differential amplifier circuit 1 of FIG. 1. FIG. 2(c) is a signal waveform chart of an output signal DeltAMPout from the differential amplifier circuit 1 of FIG. 1. FIG. 2(d) is a signal waveform chart of an operation clock inputted to an AD converter 3 of FIG. 1. FIG. 2(e) is a signal waveform chart of an AD conversion signal ADCout from the AD converter 3. FIG. 2(f) is a signal waveform chart of a demodulation control signal inputted to a digital demodulator circuit 4 of FIG. 1. FIG. 2(g) is a signal waveform chart of an AD conversion demodulation signal ADDout from the digital demodulator circuit 4 of FIG. 1.

Referring to FIG. 1, the AD converter apparatus according to the present preferred embodiment is configured to include the differential amplifier circuit (delta amplifier) 1 that amplifies a pair of differential signals Vin+ and Vin− with selectively switching between the differential signals Vin+ and Vin− so as to select and output one of the differential signals Vin+ and Vin−, the AD converter 3, and the digital demodulator circuit 4. In this case, the differential amplifier circuit 1 is configured to include coupling capacitors Cc1 and Cc2, a modulator circuit 2 that includes a switch 10 subjected to ON/OFF control based on a modulation control signal which is a data clock generated by a data clock generator 5, and an operational amplifier 20 that is, for example, a switched operational amplifier having a feedback capacitor Cf. The modulator circuit 2 is connected so as to be inserted into a virtual ground point of the operational amplifier 20. (In FIG. 1, the operational amplifier 20 includes a non-inverted input terminal connected to an analog ground point, and has a substantially infinite input impedance. Therefore, no electric current flows in the operational amplifier 20. Thus, it can be considered that an inverted input terminal is also grounded. In this case, the inverted input terminal can be defined as the virtual ground point) The data clock generator 5 generates a data clock having a data clock frequency which is higher than a frequency of the pair of inputted differential signals Vin+ and Vin− (e.g., a data clock frequency which is equal to or higher than four times as high as the frequency of the differential signal). The data clock generator 5 outputs the data clock to the modulator circuit 2 as a modulation control signal, outputs the data clock to the digital demodulator circuit 4 as a demodulation control signal, and further outputs the data clock to an operation clock generator 6. In synchronization with the data clock, the operation clock generator 6 generates an operation clock having a frequency which is higher than the frequency of the data clock (e.g., a frequency which is equal to or higher than twice as high as the frequency of the data clock), and outputs the operation clock to the AD converter 3.

Referring to FIG. 1, the non-inverted signal Vin+ of the pair of analog differential signals is inputted to an inverted input terminal of the operational amplifier 20 via the coupling capacitor Cc1 and a contact "a" of the switch 10. In addition, the inverted signal Vin− of the pair of differential signals is inputted to the inverted input terminal of the operational amplifier 20 via the coupling capacitor Cc2 and a contact "b" of the switch 10. In the switch 10 of the modulator circuit 2, as shown in FIG. 2, the contact "a" is switched over to the contact "b" or the contact "b" is switched over to the contact "a" at rising or falling of the modulation control signal. Thus, the modulator circuit 2 modulates the pair of differential signals, which are the non-inverted signal Vin+ and the inverted signal Vin−, with selectively switching between the non-inverted signal Vin+ and the inverted signal Vin− so as to select and output one of the non-inverted signal Vin+ and the inverted signal Vin−, and outputs the selected differential signal to the operational amplifier 20.

The feedback capacitor Cf is connected between the inverted input terminal and an output terminal of the operational amplifier 20, and the non-inverted input terminal is connected to the analog ground point AG. The operational amplifier 20 amplifies an inputted signal at a predetermined degree of amplification, and outputs an output signal DeltAMPout generated based on the amplification to the AD converter 3. In this case, the operational amplifier 20 performs the amplification operation at the rising or the ailing of the modulation control signal with the virtual ground point thereof being defined as an operating point (offset zero point). Therefore, as shown in FIG. 2(c), the output signal DeltAMPout outputted from the differential amplifier circuit 1 starts to change from the virtual ground point subjected to the DC offset at the rising or the falling of the modulation control signal, and is turned into a signal having a signal level within a predetermined signal range. That is, even when inputted differential signals are analog signals each having a large amplitude, the differential amplifier circuit 1 does not compress the differential signals within a power supply voltage range, but alternately folds and amplifies the differential signal to a signal having a reverse polarity (hereinafter, referred to as "a reverse polarity alternate folding and amplification process"). For this reason, there arises such an advantage that a dynamic range in the operational amplifier 20 can be made small. That is, the differential amplifier circuit 1 alternately folds and amplifies the analog input signal to a signal having different polarities so as to start from a voltage potential of the virtual ground point within a predetermined input level limit range fixed based on the modulation control signal, at a timing of the modulation control signal (See FIG. 2(c)). It is to be noted that in FIGS. 2(c), 2(e), 2(g), 5(b), and 7(b), 101 denotes a signal waveform when the contact "a" is fixed in the switch 10, and 102 denotes a signal waveform when the contact "b" is fixed in the switch 10.

Then, the AD converter 3 AD-converts the input signal into a digital AD conversion signal in accordance with the operation clock, and outputs the digital AD conversion signal to the digital demodulator circuit 4. The digital demodulator circuit 4 inverts a polarity of the inputted digital AD conversion signal ADCout at the timing of the demodulation control signal from the data clock generator 5 (which is folding timing information of the modulator circuit 2), automatically offsets the polarity at the virtual ground point, and adds the digital signal to a signal value at a preceding timing. Thus, the digital demodulator circuit 4 demodulates a signal value converted by the differential amplifier circuit 1 through the reverse polarity alternate folding and amplification process (which is a reverse process of the reverse polarity alternate folding and amplification process), and outputs the demodulated digital output signal corresponding to a signal level of the analog input signal.

The AD converter apparatus using the differential amplifier circuit 1 according to the present preferred embodiment configured as described above allows improvement in the SNR and dynamic range as compared with those of the prior art, and also allows AD conversion at higher rate with higher accuracy. In particular, the present AD converter apparatus has the following unique functions and advantageous effects.

(1) The differential amplifier circuit 1 is configured to include the operational amplifier 20 that is provided with the feedback capacitor Cf and has the virtual ground point into which the modulator circuit 2 is inserted. Therefore, the differential amplifier circuit 1 can operate at a low voltage. As the process becomes finer, the AD converter 3, which is configured to include the digital circuit and is provided at a subsequent stage of the differential amplifier circuit 1, operates at higher rate, and leads to remarkable improvement in the SNR of the entire AD converter apparatus.

(2) The change of the clock rate of the data clock allows free setting of the output amplitude range in the differential amplifier circuit 1, and this leads to alleviation of requirement for linearity specifications for the output signal.

(3) In the differential amplifier circuit 1, the output waveform is folded within the predetermined range. Therefore, the differential amplifier circuit 1 can output the signal having the voltage amplitude which is larger than the power supply voltage, upon demodulation in the digital domain. Accordingly, the differential amplifier circuit 1 can be remarkably improved in the output dynamic range.

(4) In the differential amplifier circuit 1, the signal amplitude at the virtual ground point is compressed to (1/Gain) of the original signal amplitude. Therefore, the circuit can receive a signal amplitude which is equal to or larger than the power supply voltage, and does not require any level shift circuit or any attenuator in the circuit input part, and this leads to simplification of the circuit configuration.

Second Preferred Embodiment

Figure 3:
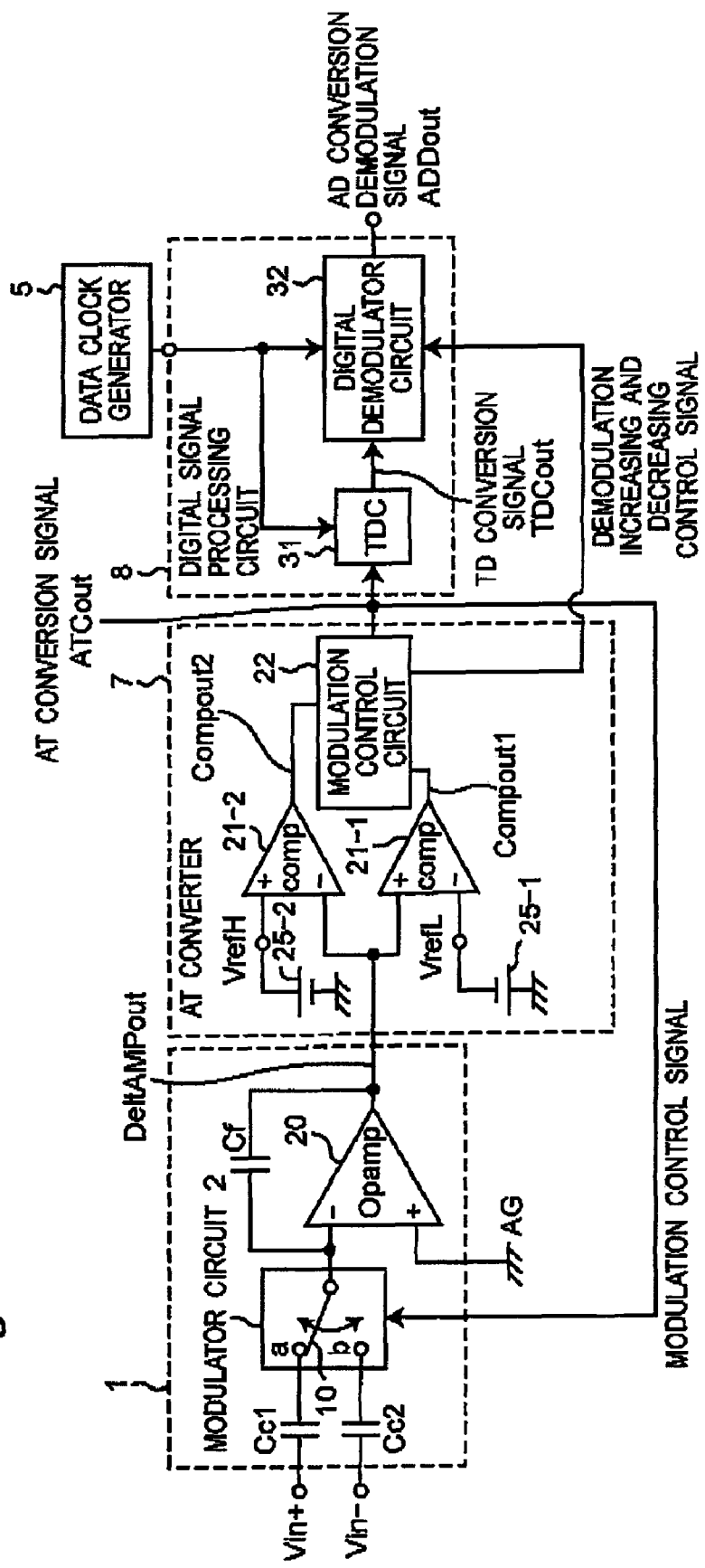
FIG. 3 is a block diagram showing a configuration of an AD converter apparatus according to a second preferred embodiment of the present invention.
Figure 4:
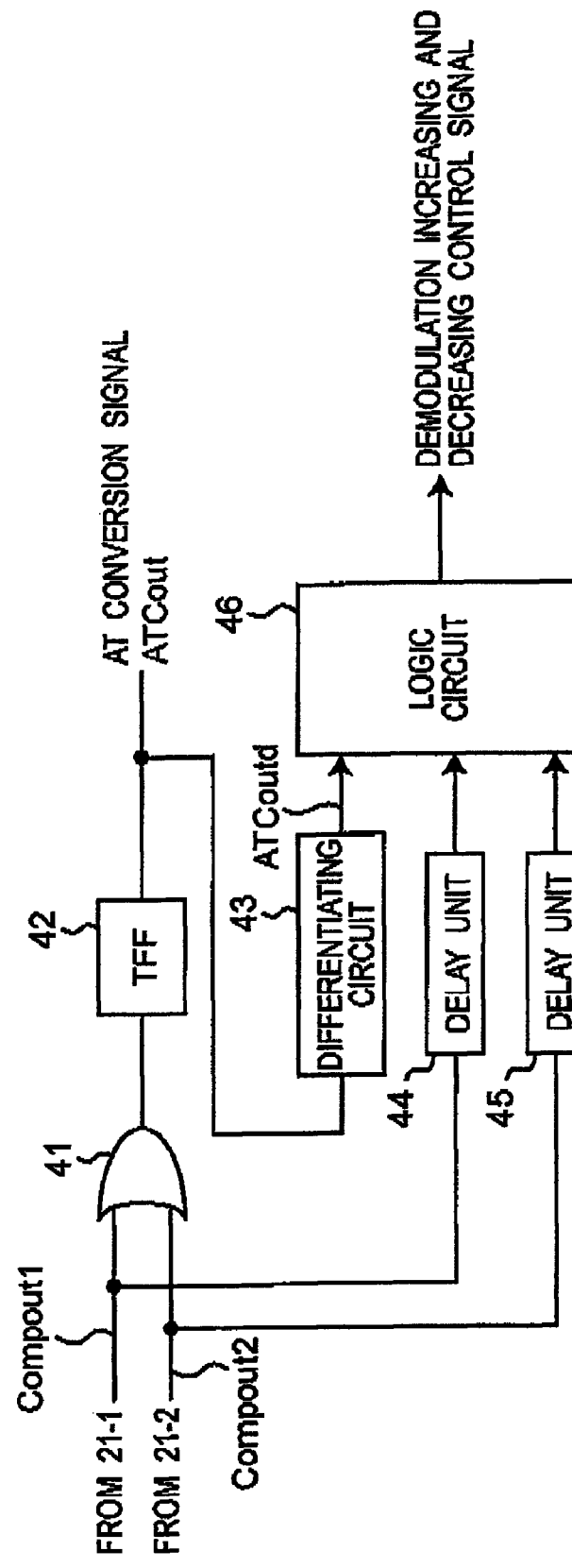
FIG. 4 is a block diagram showing a configuration of a modulation control circuit 22 of FIG. 3.
Figure 5:
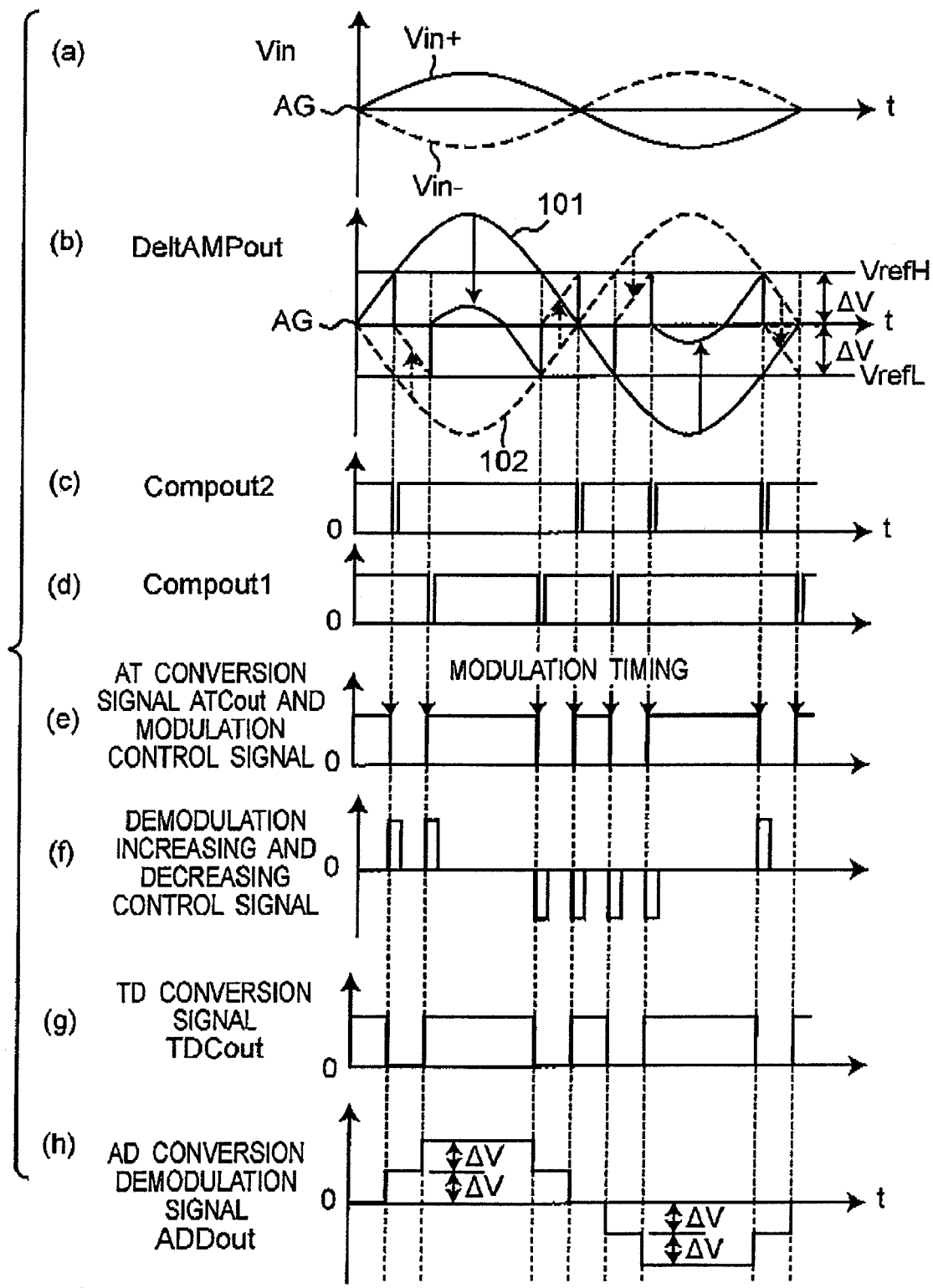
FIG. 5 shows signal waveform charts of signals representing operations of the AD converter apparatus of FIG. 3, more specifically.

FIG. 3 is a block diagram showing a configuration of an AD converter apparatus according to a second preferred embodiment of the present invention. FIG. 4 is a block diagram showing a configuration of a modulation control circuit 22 of FIG. 3. In addition, FIG. 5 shows signal waveform charts of signals representing operations of the AD converter apparatus of FIG. 3. More specifically, FIG. 5(a) is a signal waveform chart of analog signals Vin+ and Vin− inputted to a differential amplifier circuit 1 of FIG. 3. FIG. 5(b) is a signal waveform chart of an output signal DeltAMPout from the differential amplifier circuit 1 of FIG. 3. FIG. 5(c) is a signal waveform chart of an output signal Compout2 from a comparator circuit 21-2 of FIG. 3. FIG. 5(d) is a signal waveform chart of an output signal Compout1 from a comparator circuit 21-1 of FIG. 3. FIG. 5(e) is a signal waveform chart of an AT conversion signal ATCout and a modulation control signal from the modulation control circuit 22 of FIG. 3. FIG. 5(f) is a signal waveform chart of a demodulation increasing and decreasing control signal inputted to a digital demodulator circuit 32 from the modulation control circuit 22 of FIG. 3. FIG. 5(g) is a signal waveform chart of a TD conversion signal TDCout from a TD converter 31 of FIG. 3. FIG. 5(h) is a signal waveform chart of an AD conversion demodulation signal ADDout from the digital demodulator circuit 32 of FIG. 3.

The AD converter apparatus according to the second preferred embodiment is compared with the AD converter apparatus according to the first preferred embodiment shown in FIG. 1. As a result of the comparison, the two AD converter apparatuses are different from each other in the following points.

(1) An AT converter 7, a digital signal processing circuit 8, and a data clock generator 5 are provided in place of the AD converter 3 and the digital demodulator circuit 4.

(2) In the AT converter 7, the modulation control circuit 22 outputs an AT conversion signal ATCout to the digital signal processing circuit 8, and also outputs the AT conversion signal ATCout to a modulator circuit 2 as a modulation control signal. In addition, in order to demodulate a signal modulated by the modulator circuit 2, the modulation control circuit 22 generates a demodulation increasing and decreasing control signal for increasing and decreasing the demodulation signal level of the AD conversion signal, and outputs a demodulation increasing and decreasing control signal to the digital demodulator circuit 32.

(3) The data clock generator 5 generates a data clock which is different from a clock for a pair of inputted differential signals. In order to digitize and demodulate the AT conversion signal ATCout using the data clock, the data clock generator 5 outputs the data clock to the TD converter 31 and the digital demodulator circuit 32.

Hereinafter, the above differences will be described in detail.

Referring to FIG. 3, the differential amplifier circuit 1 is configured in a manner similar to that shown in FIG. 1. The modulator circuit 2 includes a switch 10, and the switch 10 includes a contact "a" and a contact "b" selected alternately based on a modulation control signal from the modulation control circuit 22.

The AT converter 7 is configured to include the two comparator circuits 21-1 and 21-2, two reference voltage sources 25-1 and 25-2, and the modulation control circuit 22. The output signal DeltAMPout from the differential amplifier circuit 1 is inputted to a non-inverted input terminal of the comparator circuit 21-1 and an inverted input terminal of the comparator circuit 21-2. A reference voltage VrefL from the reference voltage source 25-1 is applied to an inverted input terminal of the comparator circuit 21-1, and a reference voltage VrefH from the reference voltage source 25-2 is applied to a non-inverted input terminal of the comparator circuit 21-2. In this case, a voltage range from the reference voltage VrefL to the reference voltage VrefH is a linear output voltage range in the operational amplifier 20, and is set so as to be narrower than a voltage range of an inputted differential signal. It is to be noted that in the present preferred embodiment, the half of the voltage range from the reference voltage VrefL to the reference voltage VrefH is set to a voltage step ΔV.

The comparator circuit 21-1 determines whether or not the output signal DeltAMPout from the differential amplifier circuit I is smaller than a predetermined minimum reference voltage VrefL. If the output signal DeltAMPout is smaller than the minimum reference voltage VrefL, the comparator circuit 21-1 outputs a first comparison result signal Compout1 having a high level to the modulation control circuit 22. On the other hand, if the output signal DeltAMPout is not smaller than the minimum reference voltage VrefL, the comparator circuit 21-1 outputs the first comparison result signal Compout1 having a low level to the modulation control circuit 22 (See FIG. 5(d)). In addition, the comparator circuit 21-2 determines whether or not an output signal DeltAMPout from the differential amplifier circuit 1 is higher than a predetermined maximum reference voltage VrefH. If the output signal DeltAMPout is higher than the maximum reference voltage VrefH, the comparator circuit 21-2 outputs a second comparison result signal Compout2 having the high level to the modulation control circuit 22. On the other hand, if the output signal DeltAMPout is not higher than the maximum reference voltage VrefH, the comparator circuit 21-2 outputs a second comparison result signal Compout2 having the low level to the modulation control circuit 22 (See FIG. 5(c)). In the AD converter apparatus according to the present preferred embodiment, as will be described later, the switch 10 of the modulator circuit 2 is controlled by the modulation control signal so as to be switched at the time of output of one of the comparison result signals Compout1 and Compout2. In this case, such a switching timing is referred to as "a modulation timing" (See a downward arrow mark in FIG. 5(e)).

Referring to FIG. 4, the modulation control circuit 22 is configured to include an OR gate 41, a toggle flip-flop (TFF) 42, a differentiating circuit 43, two delay units 44 and 45, and a logic circuit 46. In this case, each of the delay units 44 and 45 has a delay time for delaying an input signal by a time corresponding to an operating time of each of the three circuit elements 41, 42 and 43. A first comparison result signal Compout1 from the comparator circuit 21-1 is inputted to the OR gate 41, and is also inputted to the logic circuit 46 via the delay unit 44. In addition, a second comparison result signal Compout2 from the comparator circuit 21-2 is inputted to the OR gate 41, and is also inputted to the logic circuit 46 via the delay unit 45. The toggle flip-flop (TFF) 42 detects a signal level of an output signal from the OR gate 41, at the modulation timing. Thereafter, the TFF 42 operates to hold the signal level until a subsequent modulation timing, and outputs an output signal as an AT conversion signal ATCout (See FIG. 5(e)). As shown in FIG. 3, the AT conversion signal ATCout is outputted to the TD converter 31 of the digital signal processing circuit 8, and is also outputted to the switch 10 of the modulator circuit 2 as a modulation control signal. Referring to FIG. 4, the AT conversion signal ATCout is inputted to the differentiating circuit 43. At rising of the input signal, the differentiating circuit 43 generates a signal ATCoutd having the H level, and outputs the signal ATCoutd to the logic circuit 46. At falling of the input signal, the differentiating circuit 43 generates a signal ATCoutd having the L level, and outputs the signal ATCoutd to the logic circuit 46. Based on the three inputted signals, the logic circuit 46 generates a demodulation increasing and decreasing control signal in accordance with Table 1 to be described below, i.e., a truth table, and outputs a demodulation increasing and decreasing control signal to the digital demodulator circuit 32.

TABLE 1

| Compout1 | Compout2 | ATCoutd | Demodulation increasing and decreasing control signal |
|---|---|---|---|
| 1 | 0 | 0 | 1 |
| 0 | 1 | 1 | 1 |
| 0 | 1 | 0 | 0 |
| 1 | 0 | 1 | 0 |
| 0 | 1 | 0 | 0 |
| 1 | 0 | 1 | 0 |

In this case, when the non-inverted signal Vin+ of a pair of inputted differential signals rises, the demodulation increasing and decreasing control signal has the H level. On the other hand, when the non-inverted signal Vin+ falls, the demodulation increasing and decreasing control signal has the L level. The demodulation increasing and decreasing control signal is a signal that changes in accordance with the increasing and decreasing of the inputted non-inverted signal Vin+. In order to demodulate a signal modulated by the modulator circuit 2, the demodulation increasing and decreasing control signal is generated to increase and decrease the demodulation signal level of an AD conversion signal (See FIG. 5(*f*)). In addition, the demodulation increasing and decreasing control signal may be inputted to the digital demodulator circuit 32 in synchronization with a data clock.

Figure 16:
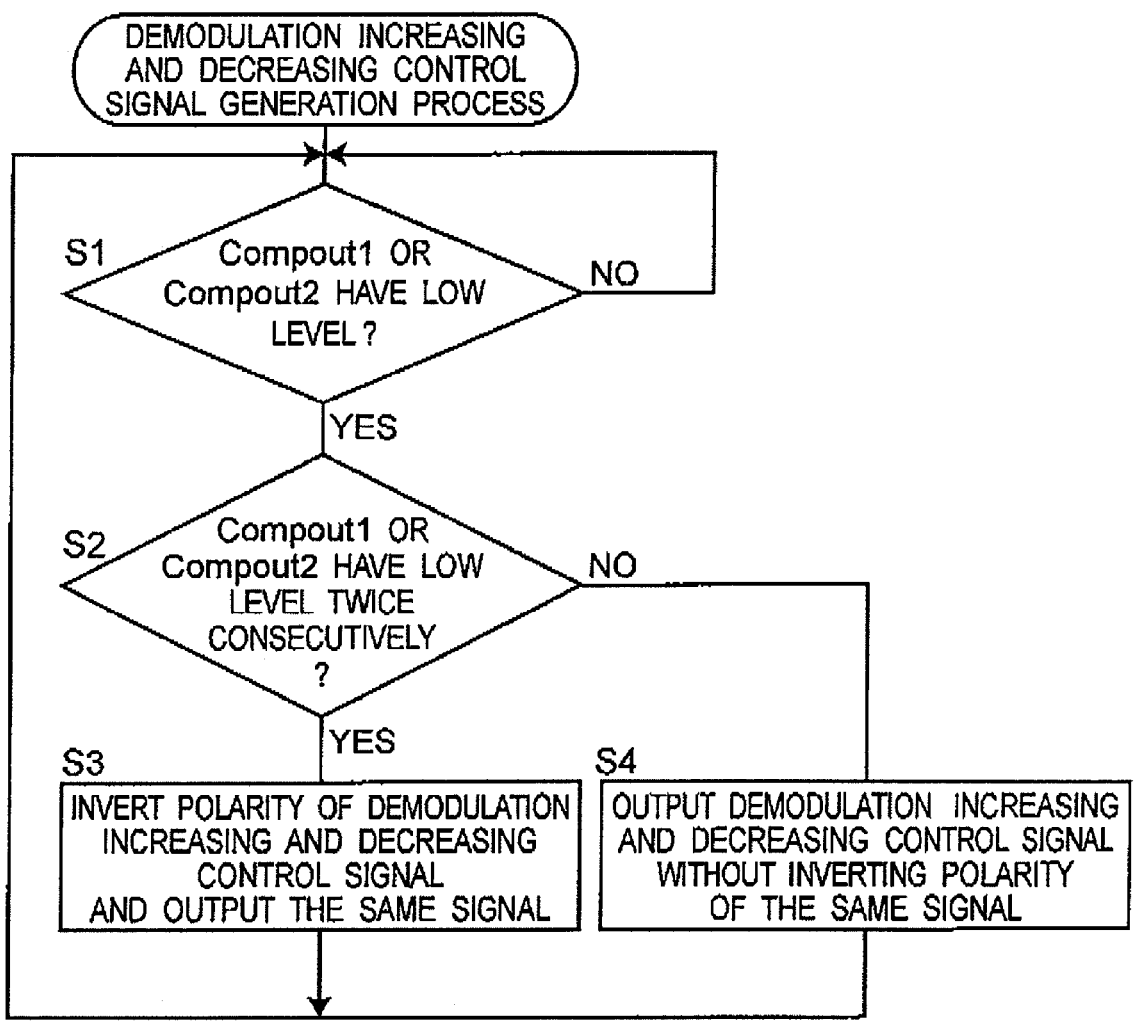
FIG. 16 shows a modified preferred embodiment of the modulation control circuit 22 of FIG. 4, and is a flow chart showing a demodulation increasing and decreasing control signal generation process.

FIG. 16 shows a modified preferred embodiment of the modulation control circuit 22 of FIG. 4, and is a flow chart showing a demodulation increasing and decreasing control signal generation process. The demodulation increasing and decreasing control signal generation process of FIG. 16 may be executed in such a manner that a hardware circuit is configured to include a CPU or a DSP rather than the modulation control circuit 22 of FIG. 4. It is to be noted that the description of the modulation control circuit 22 of FIG. 4, which will be described with reference to Table 1, corresponds to the following operations by the logic circuit that receives two comparison result signals Compout1 and Compout2.

Referring to FIG. 16, first of all, in step S1, it is determined whether or not the comparison result signal Compout1 or Compout2 has the low level. If YES, the processing routine proceeds to step S2. On the other hand, if NO, the processing routine returns to step S1. In step S2, it is determined whether or not the comparison result signal Compout1 or Compout2 has the low level twice consecutively (by two consecutive operation clocks). If YES, the processing routine proceeds to step S3. On the other hand, if NO, the processing routine proceeds to step S4. In step S3, the demodulation increasing and decreasing control signal is outputted with a polarity thereof inverted, and then, the processing routine returns to step S1. In addition, in step S4, the demodulation increasing and decreasing control signal is outputted without inversion of the polarity thereof, and then, the processing routine returns to step S1.

Referring to FIG. 3, the digital signal processing circuit 8 is configured to include the TD converter 31 and the digital demodulator circuit 32. The data clock generator 5 generates a data clock which is different from a clock for a pair of inputted differential signals. In order to digitize and demodulate an AT conversion signal ATCout using the data clock, the data clock generator 5 outputs the data clock to the TD converter 31 and the digital demodulator circuit 32. It is to be noted that the operation timing charts of FIG. 5 are shown as if the modulation timing of the modulation control signal is coincident with the timing of the data clock from the data clock generator 5. However, for clock synchronization, the digital signal processing circuit 8 utilizes the data clock from the data clock generator 5, and therefore; these timings are asynchronous to each other.

The TD converter 31 is configured to include, for example, a flip-flop. The TD converter 31 samples and holds an inputted AT conversion signal ATCout using a data clock. Thus, the TD converter 31 TD-converts a time signal representing a modulation timing into a digital signal which is synchronous to the data clock, and outputs the signal subjected to the TD conversion to the digital demodulator circuit 32 as a TD conversion signal TDCout. When a demodulation increasing and decreasing control signal has the H level, the digital demodulator circuit 32 increases a signal level of an AD conversion demodulation signal ADDout by the predetermined voltage step $\Delta V$ to generate and output the AD conversion demodulation signal ADDout, at the timing of the inputted TD conversion signal TDCout. On the other hand, when the demodulation increasing and decreasing control signal has the L level, the digital demodulator circuit 32 decreases the signal level of the AD conversion demodulation signal ADDout by the predetermined voltage step $\Delta V$ to generate and output the AD conversion demodulation signal ADDout, at the timing of the inputted TD conversion signal TDCout. In this case, the AD conversion demodulation signal ADDout is a signal obtained by AD-converting the inputted differential signal.

Next, description will be given of functions and advantageous effects of the AD converter apparatus according to the present preferred embodiment.

A typical AD converter samples an analog signal, and then, quantizes the analog signal to convert the analog signal into digital data. In contrast to this, the AD converter apparatus according to the present preferred embodiment includes an ATD converter as a combination of the AT converter 7 with the TD converter 31. As shown in FIG. 3, the AD converter apparatus amplifies an inputted differential signal, and then, folds the differential signal when the signal reaches a reference voltage (VrefH or VrefL). In this case, the AD converter apparatus detects a timing when the input signal reaches the reference voltage, and outputs an AT conversion signal ATCout in a form of a pulse signal. Thus, the AD converter apparatus converts the analog signal (voltage value) into time information (pulse interval). Thereafter, the AD converter apparatus converts the time information into digital data using the TD converter 31. In the CMOS technique which becomes finer, a signal band of an analog circuit is enlarged, so that an operating frequency is improved. However, reduction of a power supply voltage due to the fine process makes it difficult to realize an AD converter having a high dynamic range. In contrast to this, the ATD conversion requires no high voltage resolution, and allows an operation at a low power supply voltage. In addition, the folding of the input signal allows processing of a signal amplitude exceeding the power supply voltage, and therefore, it is remarkably suitable for the fine process.

In the AD converter apparatus including the ATD converter configured as described above, the AT converter 7 detects a timing when an output signal from the differential amplifier circuit 1 reaches the reference voltage VrefH or VrefL, and this timing is fed back as a control signal to the modulator circuit 2 of the differential amplifier circuit 1. The modulator circuit 2 is subjected to asynchronous control using an AT conversion signal ATCout from the AT converter 7, so that the input signal can be folded between the maximum reference voltage VrefH and the minimum reference voltage VrefL. The output signal from the differential amplifier circuit 1 is folded within the reference voltage VrefH or VrefL, and therefore, the AD converter apparatus can handle a signal having a large amplitude which exceeds the power supply voltage. In addition, the differential amplifier circuit 1 processes a signal only within the limited voltage range (in the vicinity of the center of an input and output voltage). For this reason, the AD converter apparatus has such a unique advantageous effect that the AD converter apparatus is less susceptible to an influence of non-linearity of the differential amplifier circuit 1.

Accordingly, the AD converter apparatus according to the present preferred embodiment has the following unique functions and advantageous effects.

(1) The differential amplifier circuit 1 is configured to include the operational amplifier 20 that is provided with the feed back capacitance circuit and has the virtual ground point into which the modulator circuit 2 is inserted. Therefore, the differential amplifier circuit 1 can operate at a low voltage. As the process becomes finer, the ATD converter (7, 31), which is configured to include a digital circuit and is provided at a subsequent stage of the differential, amplifier circuit 1, operates at higher rate, and this leads to remarkable improvement in the SNR of the entire AD converter apparatus.

(2) The reference voltages of the comparator circuits 21-1 and 21-2 allow free setting of the output amplitude range in the operational amplifier 20, and this leads to alleviation of requirement for linearity specifications for the output signal.

(3) In the operational amplifier 20, the output waveform is folded within the range of the reference voltages. Therefore, the operational amplifier 20 can output a signal having a voltage amplitude which is larger than a power supply voltage, upon demodulation in a digital domain. Accordingly, the circuit can be remarkably improved in output dynamic range.

(4) In the operational amplifier 20, the signal amplitude at the virtual ground point is compressed to (1/Gain) of the original signal amplitude. Therefore, the circuit can receive a signal amplitude which is equal to or larger than the power supply voltage, and does not require any level shift circuit or any attenuator in the circuit input part, and this leads to simplification of the circuit configuration.

In the second preferred embodiment described above, the two comparator circuits 21-1 and 21-2 are used; however, the present invention is not limited thereto. For example, the signal may be folded and detected by only one of the comparator circuits 21-1 and 21-2 if the maximum reference voltage VrefH and the minimum reference voltage VrefL, are substantially identical to each other.

Third Preferred Embodiment

Figure 6:
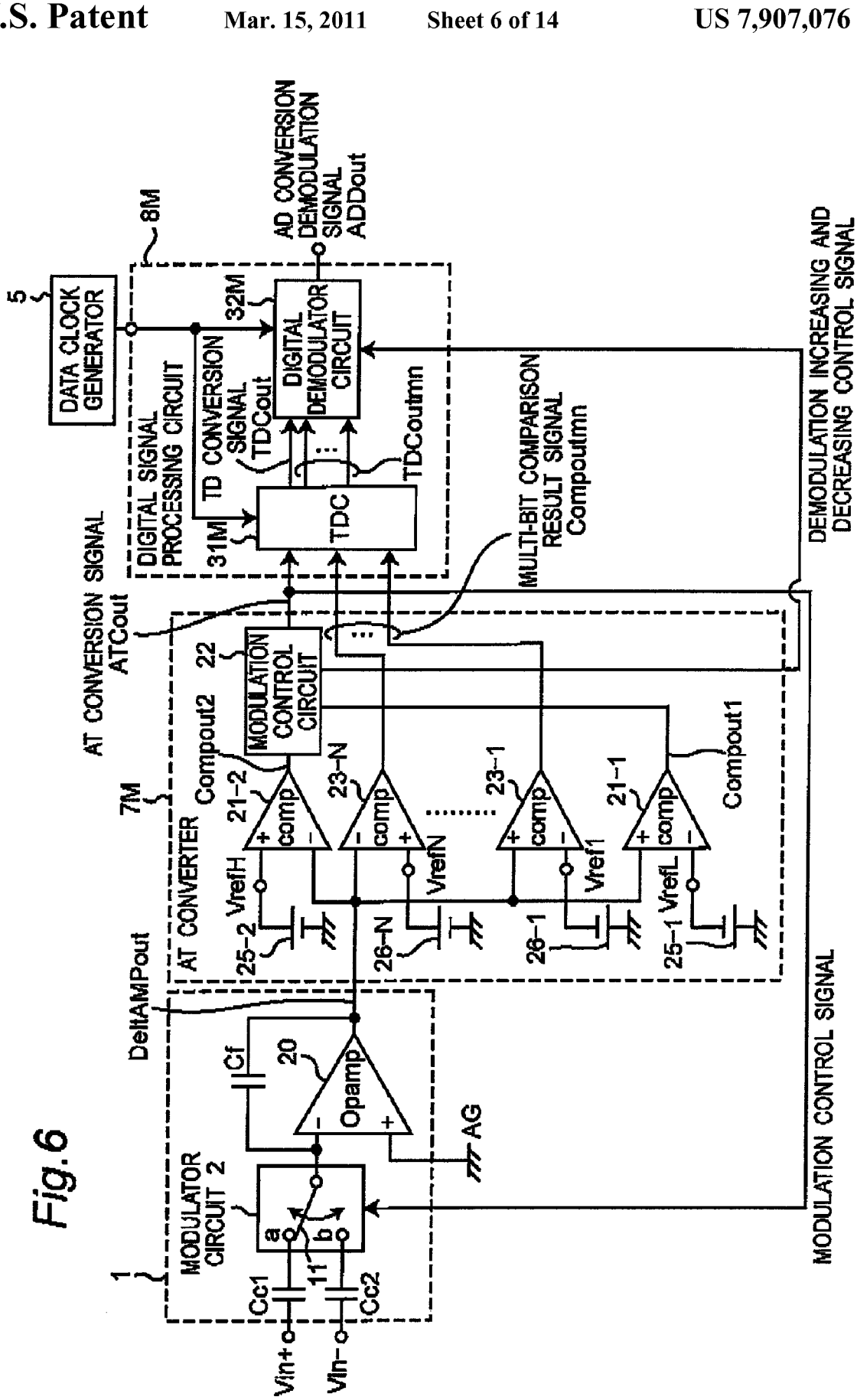
FIG. 6 is a block diagram showing a configuration of an AD converter apparatus according to a third preferred embodiment of the present invention.
Figure 7:
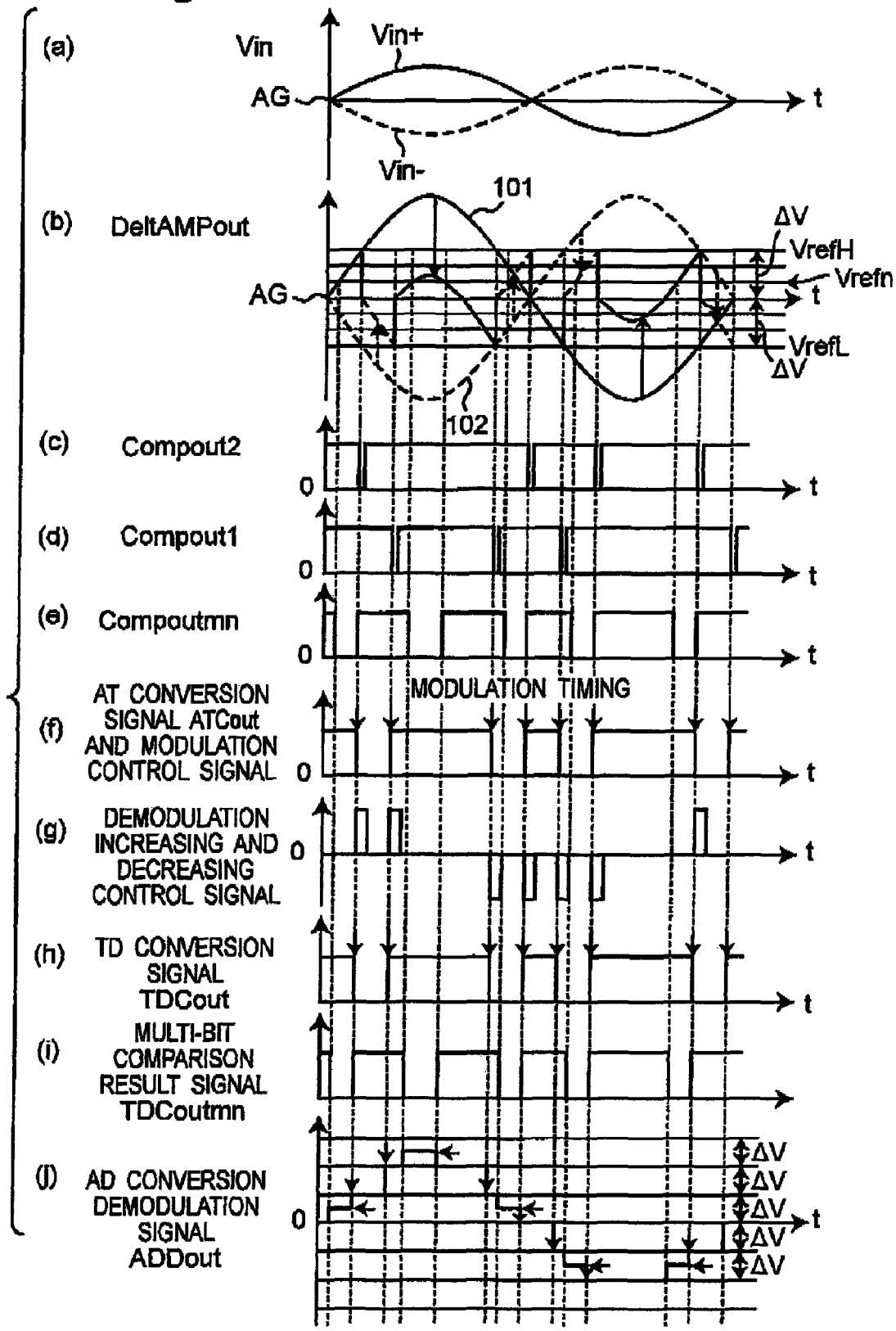
FIG. 7 shows signal waveform charts of signals representing operations of the AD converter apparatus of FIG. 6, more specifically.
Figure 8:
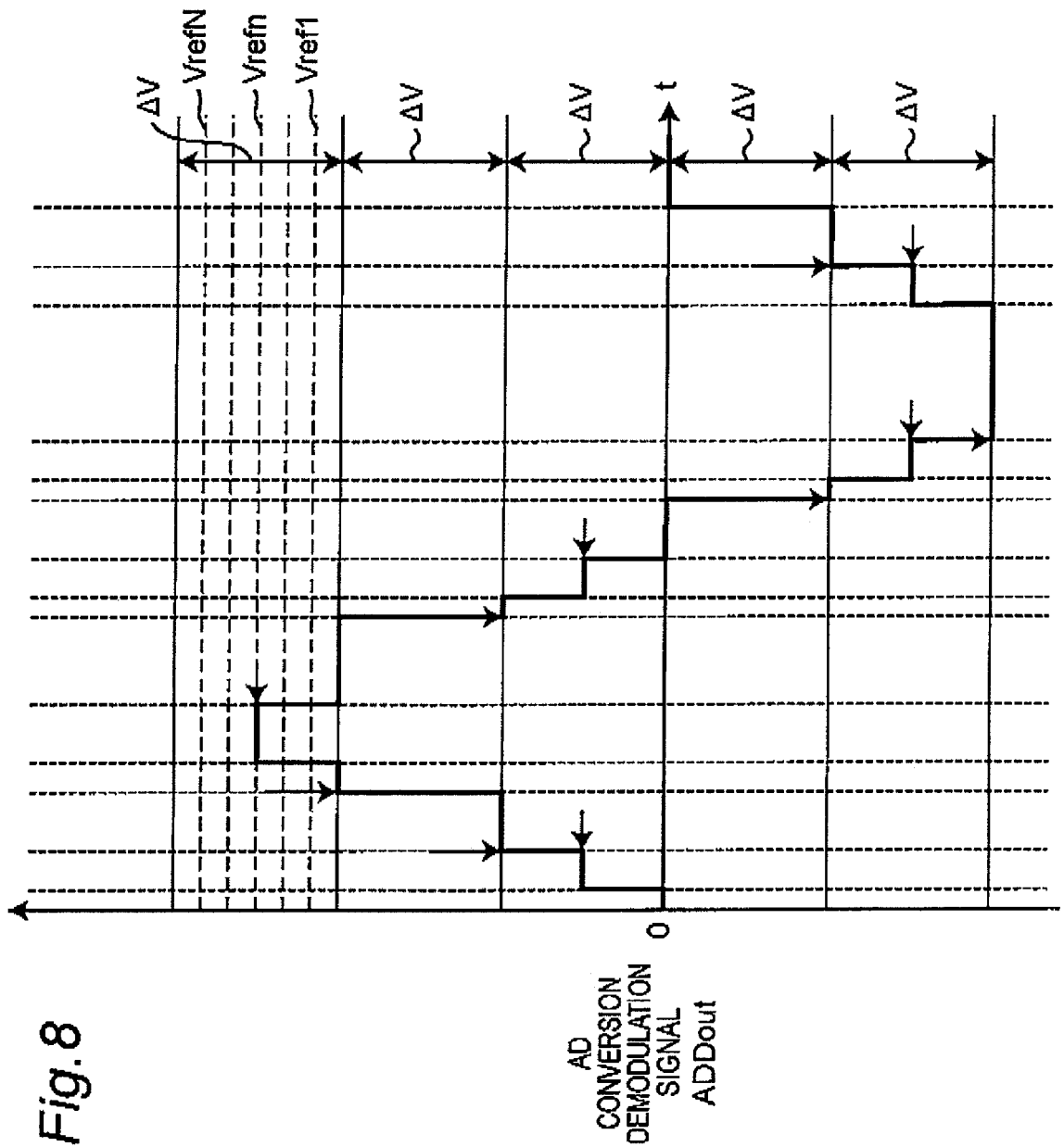
FIG. 8 is an enlarged view of the AD conversion demodulation signal ADDout of FIG. 7(j)

FIG. 6 is a block diagram showing a configuration of an AD converter apparatus according to a third preferred embodiment of the present invention. FIG. 7 shows signal waveform charts of signals representing operations of the AD converter apparatus of FIG. 6. More specifically, FIG. 7(a) is a signal waveform chart of analog signals Vin.+ and Vin− inputted to a differential amplifier circuit 1 of FIG. 6. FIG. 7(b) is a signal waveform chart of an output signal DeltAMPout from the differential amplifier circuit 1 of FIG. 6. FIG. 7(c) is a signal waveform chart of an output signal Compout2 from a comparator circuit 21-2 of FIG. 6. FIG. 7(d) is a signal waveform chart of an output signal Compout1 from a comparator circuit 21-1 of FIG. 6. FIG. 7(e) is a signal waveform chart of an output signal Compoutmn from a comparator circuit 23-$n$ (n=1, 2, ..., N) of FIG. 6. FIG. 7(f) is a signal waveform chart of an AT conversion signal ATCout and a modulation control signal from a modulation control circuit 22 of FIG. 6. FIG. 7(g) is a signal waveform chart of a demodulation increasing and decreasing control signal from the modulation control circuit 22 of FIG. 6. FIG. 7(h) is a signal waveform chart of a TO conversion signal TDCout from a TD converter 31M of FIG. 6. FIG. 7(i) is a signal waveform chart of a multi-bit comparison result signal TDCoutmn from the TD converter 31M of FIG. 6. FIG. 7(j) is a signal waveform chart of an AD conversion demodulation signal ADDout from a digital demodulator circuit 32M of FIG. 6. Further, FIG. 8 is an enlarged view of the AD conversion demodulation signal ADDout of FIG. 7(j). It is to be noted that FIGS. 7(j) and 8 are schematic views for facilitation of understanding of circuit operations of FIG. 6, and show waveforms when only the comparator circuits 21-1, 21-2 and 23-$n$ of FIG. 6 operate. In this case, when all the comparator circuits 21-1, 21-2 and 23-1 to 23-N operate, the AD conversion signal ADDout changes by a predetermined change amount $\Delta V/N$ every time the output signal DeltAMPout from the differential amplifier circuit 1 exceeds threshold values Vref1 to VrefN.

The AD converter apparatus according to the third preferred embodiment is compared with the AD converter apparatus according to the second preferred embodiment shown in FIG. 3. As a result of the comparison, the two AD converter apparatuses are different from each other in the following points.

(1) The AT converter 7 of FIG. 3 employs the two reference voltages VrefL and VrefH. On the other hand, an AT converter 7M according to the third preferred embodiment further includes the comparator circuits 23-1 to 23-N having reference voltage sources 26-1 to 26-N for a plurality of N reference voltages Vrefn (n=1, 2, ..., N) positioned between the two reference voltages VrefL and VrefH, in order to perform a multi-bit operation.

(2) A digital signal processing circuit 8M for the multi-bit operation is provided in place of the digital signal processing circuit 8 of FIG. 3.

Hereinafter, the above differences will be described.

Referring to FIG. 6, the AT converter 7M is configured to further include the plurality of N comparator circuits 23-$n$ (n=1, 2, ..., N) and the plurality of N reference voltage sources 26-$n$ (n=1, 2, ..., N), in addition to the constituent elements of the AT converter 7 of FIG. 3. In this case, the reference voltage sources 26-$n$ have the plurality of N reference voltages Vrefn positioned between the two reference voltages VrefL and VrefH (VrefL<Vref1<Vref2< ... <VrefN−1<VrefN<VrefH). In the present preferred embodiment, for example, N is an even number which is equal to or larger than 4. The reference voltages VrefL, Vref1, Vref2, ..., and Vref(N/2−1) have a negative voltage, respectively, and the reference voltages Vref(N/2+1), ..., Vref(N−1), VrefN and VrefH have a positive voltage, respectively. The negative reference voltage Vrefn from the reference voltage source 26-$n$ is applied to an inverted input terminal of the comparator circuit 23-$n$ (n=1, 2, ..., N/2−1), and an output signal DeltAMPout from the differential amplifier circuit 1 is inputted to a non-inverted input terminal of the comparator circuit 23-$n$. The positive reference voltage Vrefn from the reference voltage source 26-$n$ is applied to a non-inverted input terminal of the comparator circuit 23-$n$ (n=N/2+1, ..., N−1, N), and the output signal DeltAMPout from the differential amplifier circuit 1 is inputted to an inverted input terminal of the comparator circuit 23-$n$. In addition, a median value of the reference voltages may be set to 0 V if N is an odd number which is equal to or larger than 5. Each comparator circuit 23-n compares the input signal with the reference voltage Vrefn. As a result of the comparison, if the input signal is equal to or larger than the reference voltage, each comparator circuit 23-n outputs a comparison result signal Comoutmn having the H level. On the other hand, if the input signal is smaller than the reference voltage, each comparator circuit 23-n outputs a comparison result signal Comoutmn having the L level (See FIG. 7(*e*)). In this case, the N comparison result signals Comoutmn (n=1, 2, . . . , N) are intermediate comparison result signals between the two reference voltages VrefH and VrefL, which are referred to as multi-bit comparison result signals. The multi-bit comparison result signal Comoutmn (n=1, 2, . . . , N) is outputted to the TD converter 31M of the digital signal processing circuit 8M. In this case, the multi-bit comparison result signal Comoutmn (n=1, 2, . . . , N) indicates a specific signal level of an inputted differential signal between the two reference voltages VrefL and VrefH, and is a signal for outputting a thermal code of a so-called flash type AD converter.

Referring to FIG. 6, the digital signal processing circuit 8M is configured to include the TD converter 31M substituted for the TD converter 31 of FIG. 3, and the digital demodulator circuit 32M substituted for the digital demodulator circuit 32 of FIG. 3. The TD converter 31M is configured to include, for example, a flip-flop. The TD converter 31M samples and holds an inputted AT conversion signal ATCout using a data clock. Thus, the TD converter 31M TD converts a time signal representing a modulation timing into a digital signal which is synchronous to the data clock, and outputs the signal subjected to the TD conversion to the digital demodulator circuit 32M as a TD conversion signal TDCout. In addition, the TD converter 31M also samples and holds an inputted multi-bit comparison result signal Comoutmn (n=1, 2, . . . , N) using a data clock. Thus, the TD converter 31M TD-converts the inputted signal into a digital signal which is synchronous to the data clock, and outputs the signal subjected to the TD conversion to the digital demodulator circuit 32M as a multi-bit comparison result signal TDCoutmn (See FIG. 7(*i*)).

When the demodulation increasing and decreasing control signal has the H level, the digital demodulator circuit 32M increases a signal level of an AD conversion demodulation signal ADD out by the predetermined voltage step $\Delta V$ at a timing of an inputted TD conversion signal TDCout (See downward arrow marks shown in FIGS. 7(*j*) and 8) to generate the AD conversion demodulation signal ADDout. On the other hand, when the demodulation increasing and decreasing control signal has the L level, the digital demodulator circuit 32M decreases the signal level of the AD conversion demodulation signal ADDout by the predetermined voltage step $\Delta V$ at the liming of the inputted TD conversion signal TDCout to generate the AD conversion demodulation signal ADDout. In addition, the digital demodulator circuit 32M increases or decreases the signal level of the AD conversion demodulation signal ADDout by a smaller specific voltage Vrefn in the voltage step $\Delta V$ (corresponding to the signal level of the demodulation increasing and decreasing control signal) at a timing of an inputted multi-bit comparison result signal Comoutmn (n=1, 2, . . . , N) (See lateral arrow marks shown in FIGS. 7(*j*) and 8) in order to represent a specific signal level. In this case, the AD conversion demodulation signal ADDout is a signal obtained by AD-converting an inputted differential signal.

The AD converter apparatus configured as described above has functions and the advantageous effects similar to those of the first and second preferred embodiments. In addition, the AD converter apparatus has such a unique advantageous effect that the multi-bit operations by the comparator circuits 23-1 to 23-N allow increase of the voltage resolution between the reference voltages, i.e., the voltage resolution of the AD converter, and leads to remarkable improvement in the SNR of the AD converter apparatus.

Fourth Preferred Embodiment

Figure 9:
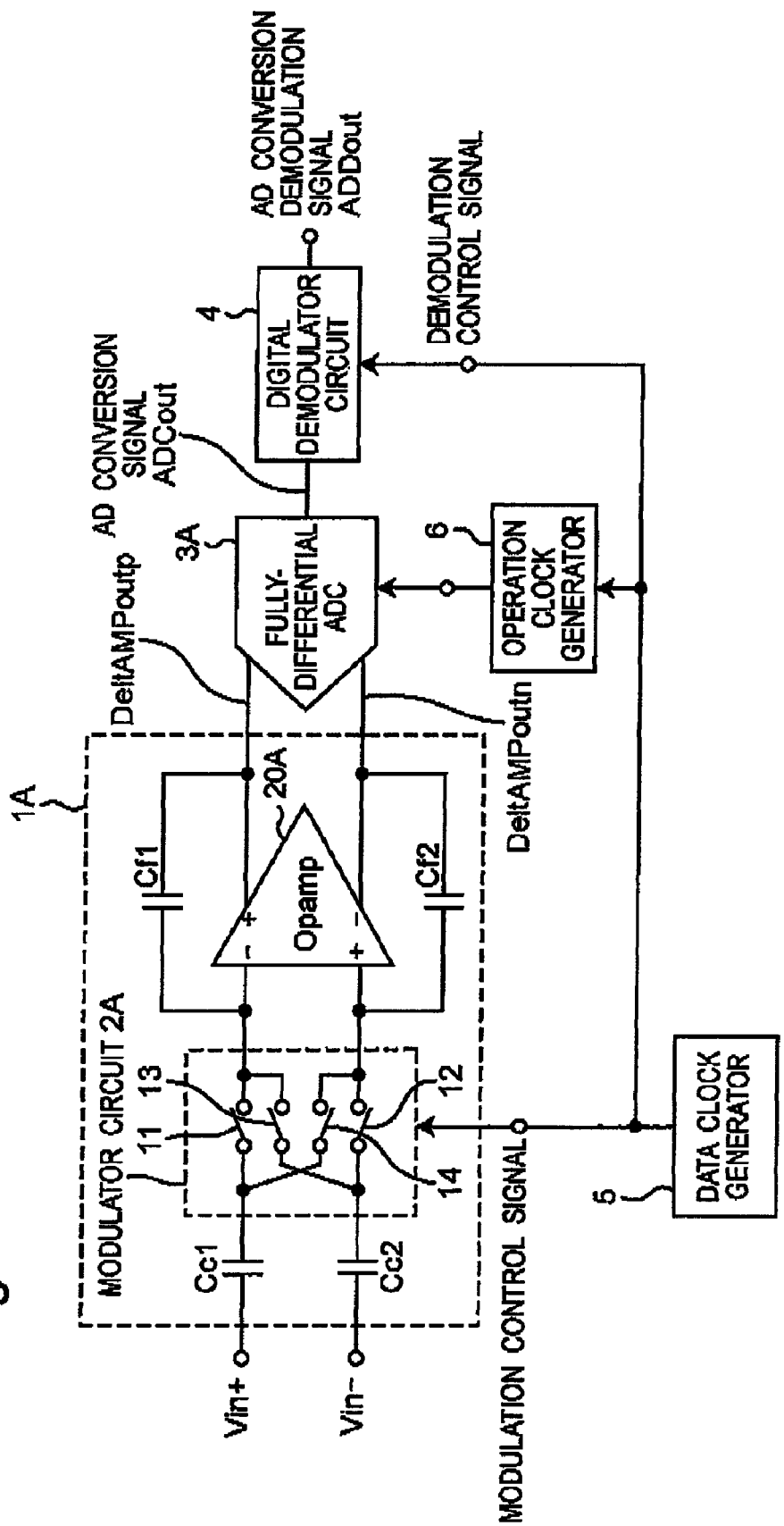
FIG. 9 is a block diagram showing a configuration of an AD converter apparatus according to a fourth preferred embodiment of the present invention.

FIG. 9 is a block diagram showing a configuration of an AD converter apparatus according to a fourth preferred embodiment of the present invention. The AD converter apparatus according to the fourth preferred embodiment is characterized in that the AD converter apparatus according to the first preferred embodiment shown in FIG. 1 is made fully differential. Specifically, the AD converter apparatus according to the fourth preferred embodiment is compared with the AD converter apparatus according to the first preferred embodiment shown in FIG. 1. As a result of the comparison, the two AD converter apparatuses are different from each other in the following points.

(1) A differential amplifier circuit 1A that is made fully differential is provided in place of the differential amplifier circuit 1 of FIG. 1.

(2) A fully-differential AD converter 3A is provided in place of the AD converter 3 of FIG. 1.

Hereinafter, the above differences will be described.

Referring to FIG. 9, the differential amplifier circuit 1A is configured to include two coupling capacitors Cc1 and Cc2, a modulator circuit 2A including four switches 11 to 14, and a differential operational amplifier 20A having two feedback capacitors Cf1 and Cf2. The non-inverted signal Vin+ of a pair of differential signals is inputted to the modulator circuit 2A via the coupling capacitor Cc1. Then, the non-inverted signal Vin+ is inputted to an inverted input terminal of the differential operational amplifier 20A via the switch 11. In addition, the non-inverted signal Vin+ is inputted to a non-inverted input terminal of the differential operational amplifier 20A via the switch 14. In addition, the inverted signal Vin− of the pair of differential signals is inputted to the modulator circuit 2A via the coupling capacitor Cc2. Then, the inverted signal Vin− is inputted to the non-inverted input terminal of the differential operational amplifier 20A via the switch 12. Further, the inverted signal Vin− is inputted to the inverted input terminal of the differential operational amplifier 20A via the switch 13. The four switches 11 to 14 are controlled as follows in accordance with a modulation control signal from a data clock generator 5. In response to the modulation control signal having the H level, the switches 11 and 12 are turned on whereas the switches 13 and 14 are turned off. In addition, in response to the modulation control signal having the L level, the switches 11 and 12 are turned off whereas the switches 13 and 14 are turned on. The output differential signals DeltA-MPoutp and DeltAMPoutn from the differential operational amplifier 20A are inputted to the fully-differential AD converter 3A. The output differential signals DeltAMPoutp and DeltAMPoutn are subjected to AD conversion in the fully-differential AD converter 3A. Then, an AD conversion signal ADCout is outputted to a digital demodulator circuit 4. The remaining functions are similar to those according to the first preferred embodiment.

The AD converter apparatus configured as described above has functions and advantageous effects which are similar to those of the AD converter apparatus according to the first preferred embodiment. In addition, the AD converter apparatus has such an advantageous effect that the circuit that is made fully differential allows improvement in the SNR for the noise in the common mode.

Fifth Preferred Embodiment

Figure 10:
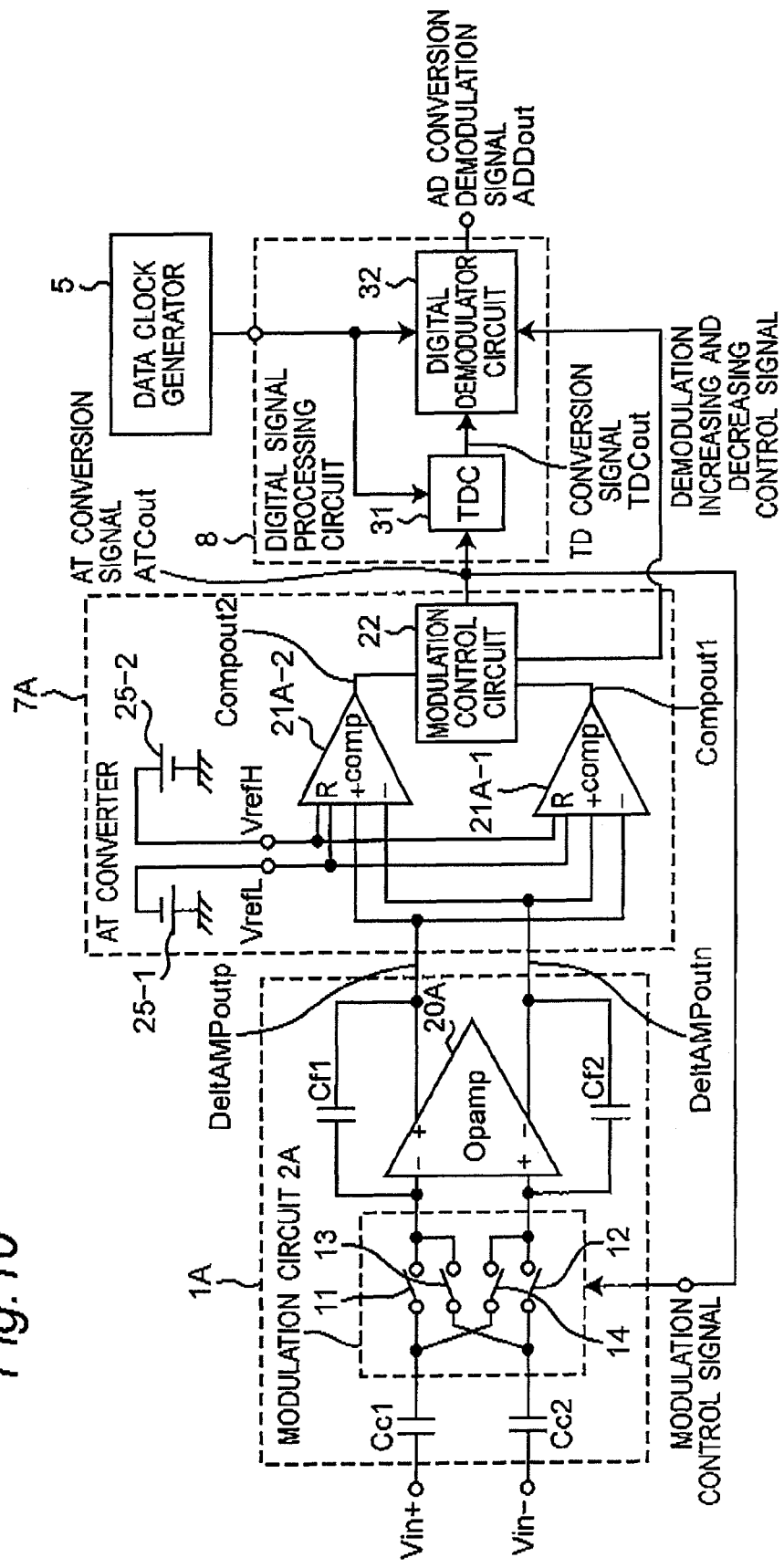
FIG. 10 is a block diagram showing a configuration of an AD converter apparatus according to a fifth preferred embodiment of the present invention.

FIG. 10 is a block diagram showing a configuration of an AD converter apparatus according to a fifth preferred embodiment of the present invention. The AD converter apparatus according to the fifth preferred embodiment is characterized in that the AD converter apparatus according to the second preferred embodiment shown in FIG. 3 is made fully differential. Specifically, the AD converter apparatus according to the fifth preferred embodiment is compared with the AD converter apparatus according to the second preferred embodiment shown in FIG. 3. As a result of the comparison, the two AD converter apparatuses are different from each other in the following points.

(1) A differential amplifier circuit 1A that is made fully differential is provided in place of the differential amplifier circuit 1 of FIG. 3.

(2) A fully-differential AT converter 7A is provided in place of the AD converter 3 shown in FIG. 3.

Hereinafter, the above differences will be described.

Referring to FIG. 10, the differential amplifier circuit 1A is configured and operates in a manner similar to that shown in FIG. 9. The fully-differential AT converter 7A is configured to include two fully-differential comparator circuits 21A-1 and 21A-2, two reference voltage sources 25-1 and 25-2, and a modulation control circuit 22. Each of the fully-differential comparator circuits 21A-1 and 21A-2 includes a non-inverted input terminal, an inverted input terminal, and two reference voltage application terminals. An output signal DeltAMPoutp from a non-inverted output terminal of a differential operational amplifier 20A of the differential amplifier circuit 1A is inputted to the inverted input terminal of the comparator circuit 21A-1 and the non-inverted input terminal of the comparator circuit 21A-2. An output signal DeltAMPoutn from an inverting output terminal of the differential operational amplifier 20A is inputted to the non-inverted input terminal of the comparator circuit 21A-1 and the inverted input terminal of the comparator circuit 21A-2. Each of the comparator circuits 21A-1 and 21A-2 compares the signal inputted to the inverted input terminal thereof with a minimum reference voltage VrefL from the reference voltage source 25-1 to obtain a comparison result signal as a first comparison result signal, in a manner similar to that of the comparator circuits 21-1 and 21-2 of FIG. 3. In addition, each of the comparator circuits 21A-1 and 21A-2 compares the signal inputted to the non-inverted input terminal thereof with a maximum reference voltage VrefH from the reference voltage source 25-2 to obtain a comparison result signal as a second comparison result signal, in a manner similar to that of the comparator circuits 21-1 and 21-2 of FIG. 3. The comparator circuits 21A-1 and 21A-2 find a logical OR of the first and second comparison results signals, and output, to the modulation control circuit 22, signals representing results of the computation as comparison result signals Compout1 and Compout2, respectively. The modulation control circuit 22 operates in a manner similar to that shown in FIG. 3, and generates and outputs an AT conversion signal ATCout and a modulation control signal as well as a demodulation increasing and decreasing control signal, based on the two comparison result signals Compout1 and Compout2. The digital signal processing circuit 8 is configured and operates in a manner similar to that shown in FIG. 3.

The AD converter apparatus configured as described above has functions and advantageous effects which are similar to those of the AD converter apparatus according to the second preferred embodiment. In addition, the AD converter apparatus has such an advantageous effect that the circuit that is made fully differential allows improvement in the SNR for the noise in the common mode.

Sixth Preferred Embodiment

Figure 11:
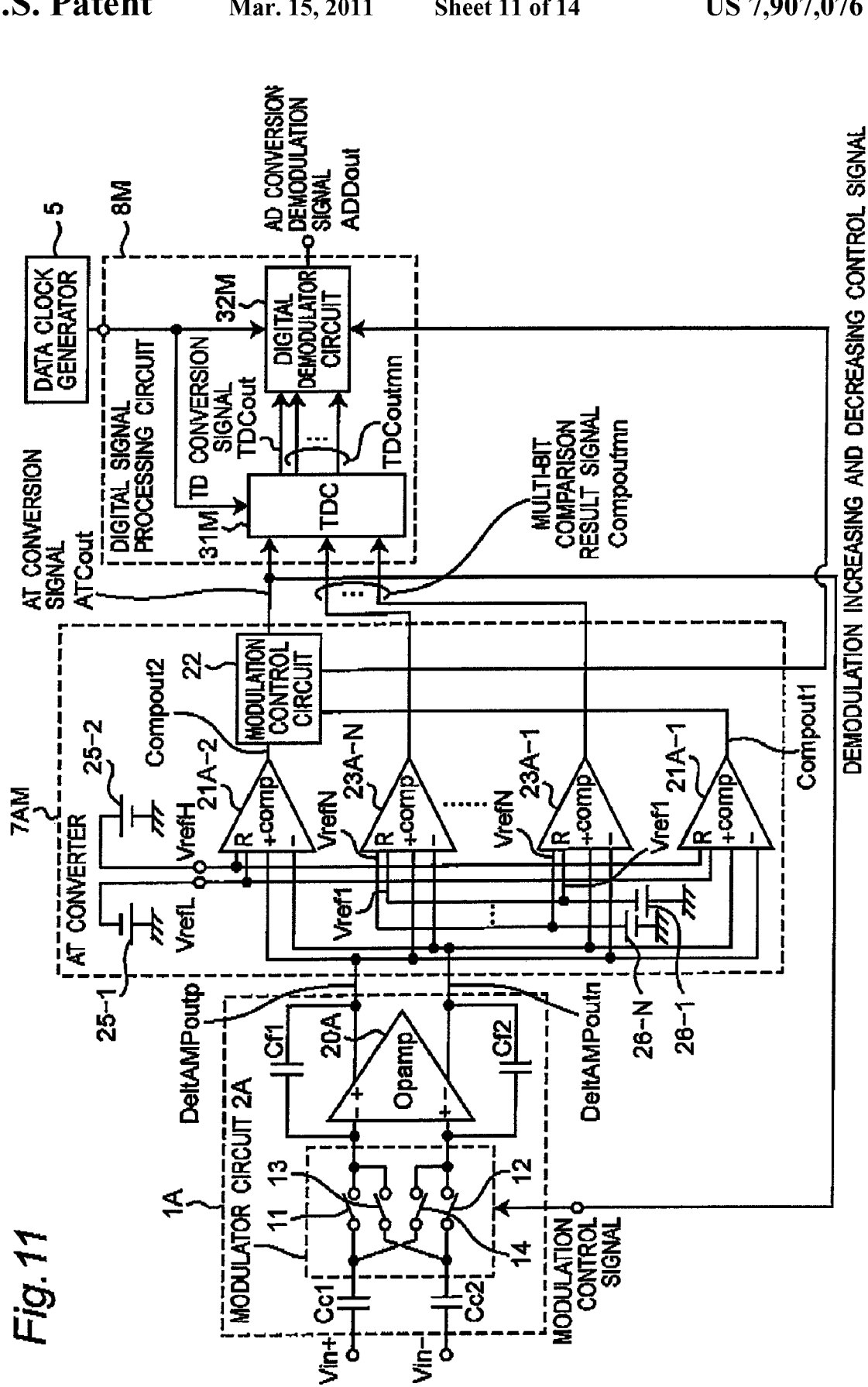
FIG. 11 is a block diagram showing a configuration of an AD converter apparatus according to a sixth preferred embodiment of the present invention.

FIG. 11 is a block diagram showing a configuration of an AD converter apparatus according to a sixth preferred embodiment of the present invention. The AD converter apparatus according to the sixth preferred embodiment is characterized in that the AD converter apparatus according to the third preferred embodiment shown in FIG. 6 is made fully differential. Specifically, the AD converter apparatus according to the sixth preferred embodiment is compared with the AD converter apparatus according to the third preferred embodiment shown in FIG. 6. As a result of the comparison, the two AD converter apparatuses are different from each other in the following points.

(1) A differential amplifier circuit 1A that is made fully differential is provided in place of the differential amplifier circuit 1 of FIG. 6.

(2) A fully-differential AT converter 7AM is provided in place of the AD converter 7M of FIG. 6.

In addition, the AD converter apparatus according to the sixth preferred embodiment is characterized in that the AD converter apparatus according to the fifth preferred embodiment shown in FIG. 10 is made to perform a multi-bit operation. Specifically, the AD converter apparatus according to the sixth preferred embodiment is compared with the AD converter apparatus according to the fifth preferred embodiment shown in FIG. 10. As a result of the comparison, the two AD converter apparatuses are different from each other in the following points.

(1) The multi-bit AT converter 7AM is provided in place of the AT converter 7A of FIG. 6.

(2) A multi-bit digital signal processing circuit 8M is provided in place of the digital signal processing circuit 8 of FIG. 6.

Hereinafter, the above differences will be described.

Referring to FIG. 11, the AT converter 7AM is configured to further include a plurality of N fully-differential comparator circuits 23A-n (n=1, 2, . . . , N), and a plurality of N reference voltage sources 26-$n$ (n=1, 2, . . . , N) having configurations similar to those according to the third preferred embodiment, in addition to the constituent elements of the AT converter 7A of FIG. 10. The fully-differential comparator circuit 23A-n is configured and operates in a manner similar to that of the fully-differential comparator circuits 21A-1 and 21A-2, but has a reference voltage different to be compared from that of the fully-differential comparator circuits 21A-1 and 21A-2. In the present preferred embodiment, for example, N is an even number which is equal to or larger than 4. Each of reference voltages VrefL, Vref1, Vref2, . . . , and Vref(N/2−1) has a negative voltage, and each of reference voltages Vref(N/2+1), . . . , Vref(N−1), VrefN, and VrefH has a positive voltage. The reference voltage Vrefn from the reference voltage source 26-$n$ and the reference voltage Vref(N-n) from the reference voltage source 26-(N-n) are applied to two reference voltage application terminals of the fully-differential comparator circuit 23A-n (n=1, 2, . . . , N/2−1). An output signal DeltAMPoutn from a differential operational amplifier 20A is inputted to a non-inverted input terminal of the comparator circuit 23A-n (n=1, 2, . . . , N/2−1). An output signal DeltAMPoutp from the differential operational amplifier 20A is inputted to an inverted input terminal of the comparator circuit 23A-n (n=1, 2, . . . , N/2−1). In addition, the reference voltage Vrefn from the reference voltage source 26-n and the reference voltage Vref(N-n) from the reference voltage source 26-(N-n) are applied to two reference voltage application terminals of the fully-differential comparator circuit 23-n (n=N/2+1, . . . , N−1, N). The output signal DeltA-MPoutn from the differential operational amplifier 20A is inputted to an inverted input terminal of the comparator circuit 23A-n (n=N/2+1, . . . , N−1, N). The output signal DeltAMPoutp from the differential operational amplifier 20A is inputted to a non-inverted input terminal of the comparator circuit 23A-n (n=1, 2, . . . , N/2—1). The respective comparator circuits 23A-1 to 23A-N operate in a manner similar to that of the comparator circuits 21A-1 and 21A-2, generate a multi-bit comparison result signal Compoutmn, and output the multi-bit comparison result signal Compoutmn to a TD converter 31M. It is to be noted that the digital signal processing circuit 8M is configured and operates in a manner similar to that shown in FIG. 6.

The AD converter apparatus configured as described above has functions and advantageous effects which are similar to those of the AD converter apparatus according to the third preferred embodiment. In addition, the AD converter apparatus has such an advantageous effect that the circuit that is made fully differential allows improvement in SNR for the noise in the common mode.

Implemental Examples

Hereinafter, description will be given of a result of measurement using an AD converter apparatus prepared as a prototype by the present inventor. The present inventors designed and fabricated a test chip for the AD converter apparatus by a 90-nm CMOS process. This chip has an area of 500×750 μm². The operation of the TD converter 7A was measured using a digital oscilloscope that detects transition of an AT conversion signal ATCout to count a pulse width.

Figure 12:
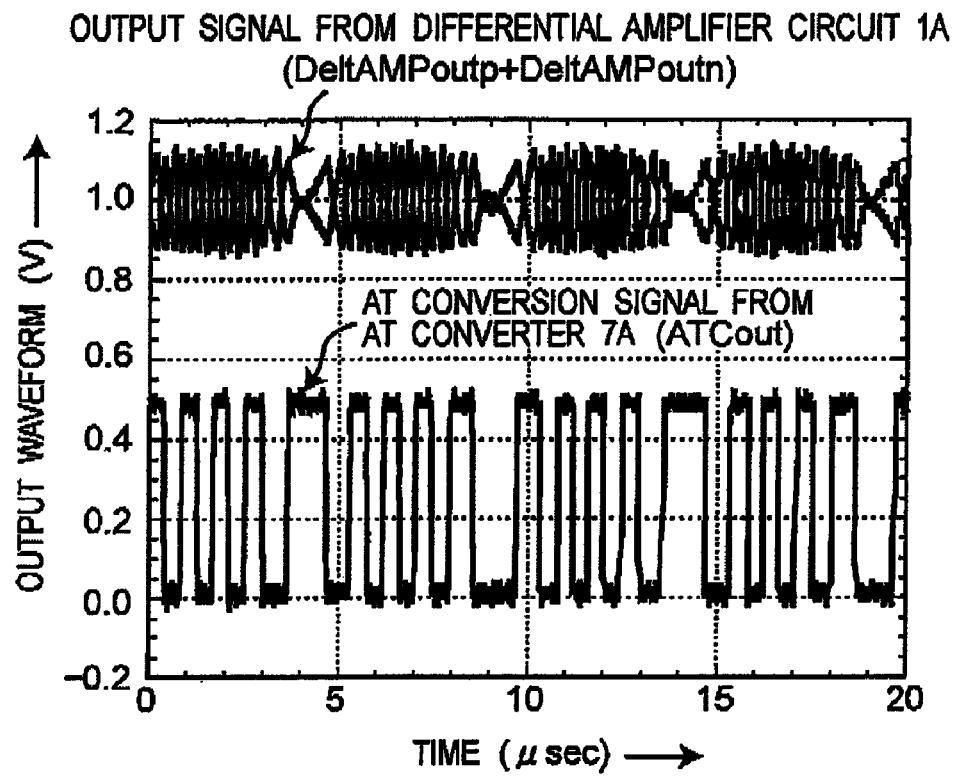
FIG. 12 shows results of simulation in the AD converter apparatus according to the fifth preferred embodiment shown in FIG. 10, and is a signal waveform chart of output signals DeltAMPoutp and DeltAMPoutn from a differential amplifier circuit 1A as well as an AT conversion signal ATCout from an AT converter 7A.

FIG. 12 shows results of measurement in the AD converter apparatus according to the fifth preferred embodiment shown in FIG. 10, and is a signal waveform chart of output signals DeltAMPoutp and DeltAMPoutn from the differential amplifier circuit 1A as well as an AT conversion signal ATCout from the AT converter 7A. That is, FIG. 12 shows waveforms of outputs from the differential amplifier circuit 1A and the AT converter 7A, when measuring a differential sinusoidal wave input signal of 100 kHz and 1.0 Vp-p upon application of a supply voltage of 0.5 V. A reference voltage VrefL and a reference voltage VrefH are 0.15 V and 0.35 V, respectively. Even when an input signal exceeds the supply voltage, the output signal from the differential amplifier circuit 1A is folded between the reference voltages. The output bit stream obtained using the TD converter having a time resolution of 1 nanosecond was demodulated to an original waveform by MATLAB.

Figure 13:
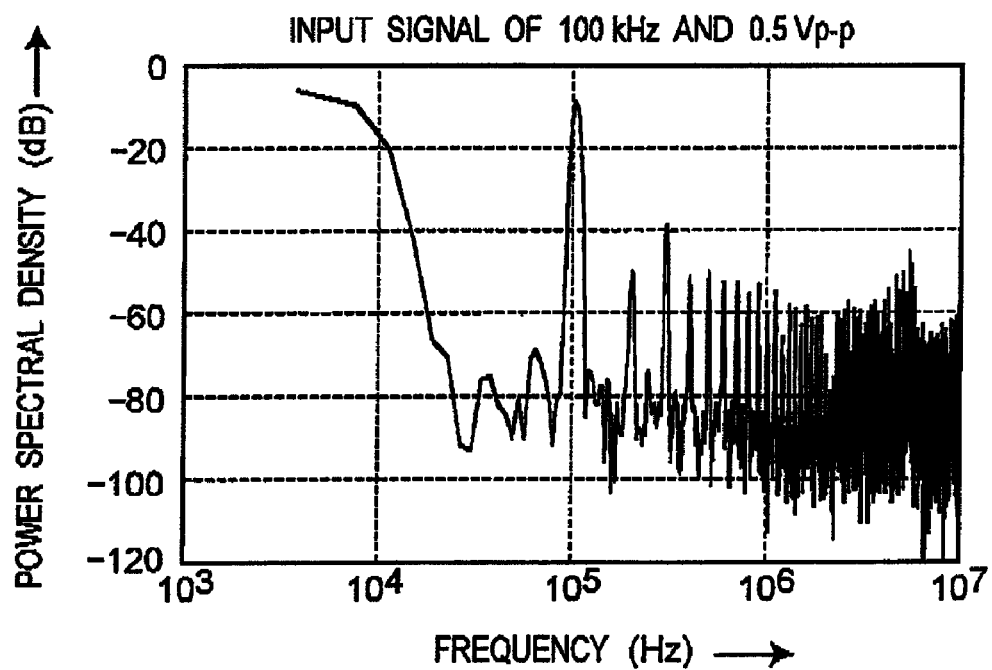
FIG. 13 shows results of simulation in the AD converter apparatus of FIG. 10 when receiving an input signal of 100 kHz and 0.5 Vp-p, and is a diagram showing a frequency characteristic concerning a power spectral density of an output signal.

FIG. 13 shows results of measurement in the AD converter apparatus of FIG. 10 when receiving an input signal of 100 kHz and 0.5 Vp-p, and is a diagram showing a frequency characteristic concerning a power spectral density of an output signal. It is apparent from FIG. 13 that it shows increase in the noise floor at lower than 50 kHz, which results from the number of FFT points. This increase is limited by a memory in the digital oscilloscope.

Figure 14:
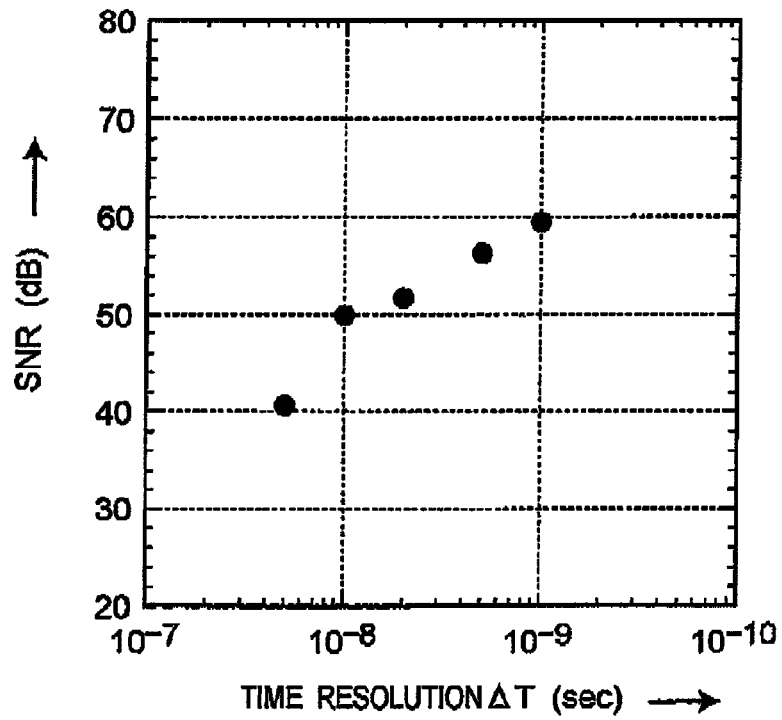
FIG. 14 shows results of measurement in the AD converter apparatus of FIG. 10, and is a graph showing an SNR relative to a time resolution ΔT.

FIG. 14 shows results of measurement in the AD converter apparatus of FIG. 10, and is a graph showing an SNR relative to a time resolution ΔT. In FIG. 14, a differential sinusoidal wave input signal has a voltage amplitude of 1 Vp-p and a frequency of 100 kHz. The AD converter apparatus was activated at a supply voltage of 0.5 V. The SNR is improved up to 60 dB because of increase of the time resolution ΔT.

Figure 15:
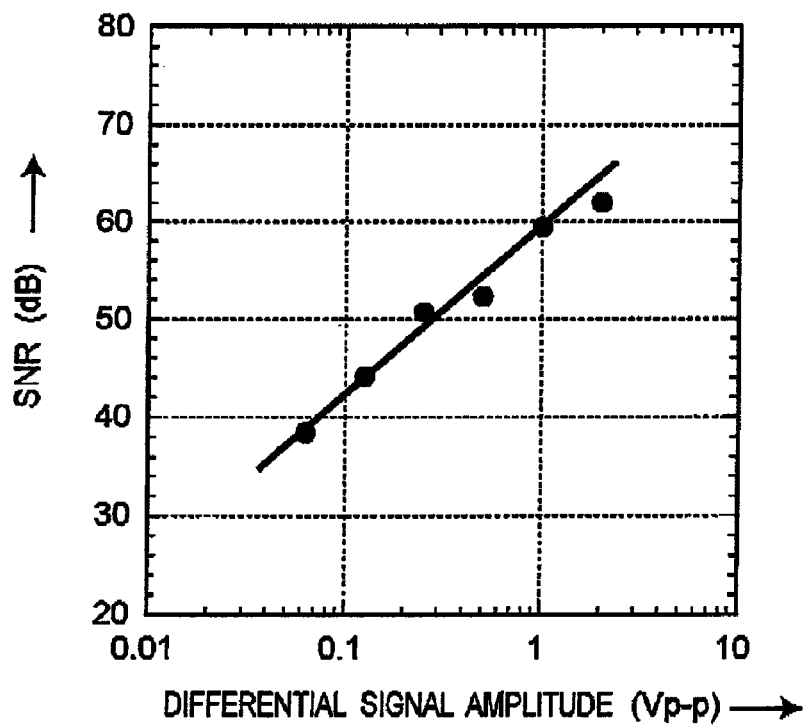
FIG. 15 shows results of measurement in the AD converter apparatus of FIG. 10, and is a graph showing an SNR relative to an amplitude of a differential signal.

FIG. 15 shows results of measurement in the AD converter apparatus of FIG. 10, and is a graph showing an SNR relative to an amplitude of a differential signal. As is apparent from FIG. 15, it is understand that the differential amplifier circuit 1A can process a differential signal amplitude which is four times as large as the power supply voltage. The AD converter apparatus achieved an SNR of 62 dB using a signal of 100 kHz, an input amplitude of 2.0 Vp-p, and a bandwidth of 120 kHz. A measured value of power consumption was 150 μW (where the power consumption of the differential amplifier circuit 1A is 120 μW, and the power consumption of the AT converter 7A is 30 μW) at a supply voltage of 0.5 V, which was judged a low voltage.

As described above, there has been proposed the AD converter apparatus which is the new AD conversion architecture that operates in a unique signal process using high-resolution sampling after amplitude quantization. By use of the differential amplifier circuit 1A as well as the comparator circuits 21A-1 and 21A-2, a large-scaled input signal amplitude exceeding a supply voltage is converted into to a pulse timing and is folded within a small reference voltage range. The pulse timing is converted into a binary digital data signal by a logic process having a high-rate clock. In the AD converter apparatus, the 90-nm CMOS test chip achieved the SNR of 62 dB by the signal bandwidth of 120 kHz and the input voltage range of 2.0 Vp-p, and also achieved the power consumption of 150 μW at the supply voltage of 0.5 V. This architecture is advantageous for various kids of applications requiring higher linearity and higher dynamic range at low supply voltage and low power.

Summary of the Preferred Embodiments

According to the preferred embodiment of the present invention, the AD converter apparatus is configured to include the differential amplifier circuit that employs the capacitance feedback configuration in which the modulator circuit is inserted into the imaginary ground voltage potential point, the comparator circuit that detects the output voltage from the differential amplifier circuit, and the TD converter that detects a response time by the comparator circuit. The output signal from the differential amplifier circuit as well as reference voltages VrefH and VrefL are inputted to the comparator circuit. When the output signal exceeds a reference voltage range, the signal path in the modulator circuit is controlled so as to be switched. By this control, the output waveform from the differential amplifier circuit is folded within the reference voltage range, which allows use of only a range capable of outputting a linear signal. In this case, the difference in voltage potential between the reference voltages corresponds to the voltage resolution of the AD converter apparatus. The voltage data and time data of the input signal can be determined by acquisition of digital data of a difference in the reference voltage potential, digital data of count of folding of the output waveform and digital data of a timing of folding of the output waveform. Therefore, the circuit apparatus according to the preferred embodiment of the present invention operates as the AD converter apparatus.

Accordingly, the AD converter apparatus according to the preferred embodiment of the present invention can output the signal having the voltage amplitude larger than the power supply voltage upon demodulation in the digital domain. In addition, the signal amplitude at the virtual ground point is compressed to (1/Gain) of the original signal amplitude, and therefore, the circuit apparatus can receive the signal amplitude which is equal to or larger than the power supply voltage. Accordingly, the circuit apparatus can be improved in the dynamic range and the SNR as compared with those of the prior art. In the differential amplifier circuit 1, the signal amplitude at the virtual ground point is compressed to (1/Gain) of the original signal amplitude, and therefore, the differential amplifier circuit 1 can receive the signal amplitude which is equal to or larger than the power supply voltage. Accordingly, the AD converter apparatus does not require any level shift circuit or any attenuator in the circuit input part.

With regard to the AD converter apparatus according to the preferred embodiment of the present invention, as described above, the multi-bit AD converter apparatus can be configured using two or more comparators. Then, only the two comparator circuits receiving reference voltages VrefH and VrefL perform select control for switching in the modulator circuit, so as to operate as the AD converter apparatus. The remaining comparator circuits receive predetermined different reference voltages within the range from the reference voltage VrefH to the reference voltage VrefL, and output timing data when the received reference voltage exceeds each reference voltage. The application of the plurality of comparator circuits to the AD converter apparatus brings about such a unique advantageous effect that the voltage resolution between reference voltage potentials, i.e., the voltage resolution of the AD converter increases, and this leads to improvement in the SNR of the AD converter apparatus.

As described above in detail, the differential amplifier circuit according to the present invention and the AD converter apparatus using the same allow provision of the differential amplifier circuit that allows improvement in the SNR and dynamic range as compared with those of the prior art and provision of an At) converter apparatus that can Operate at higher rate with higher accuracy as compared with that of the prior art, using the differential amplifier circuit. In particular, the differential amplifier circuit according to the present invention and the AD converter apparatus using the same have the following unique functions and advantageous effects.

(1) The differential amplifier circuit is configured to include the operational amplifier that is provided with the feedback capacitance circuit and has a virtual ground point into which the modulator circuit is inserted. Therefore, the differential amplifier circuit can operate at a low voltage. As the process becomes finer, the AD converter, which is configured to include the digital circuit and is provided at a subsequent stage of the differential amplifier circuit, operates at higher rate, and leads to remarkable improvement in the SNR of the entire AD converter apparatus.

(2) The multi-bit operation by the comparator allows increase of the voltage resolution between reference voltage potentials, i.e., the voltage resolution of the AD converter, and this leads to remarkable improvement in the SNR of the AD converter apparatus.

(3) The reference voltages of the comparator allow free setting of the output amplitude range in the operational amplifier, and this leads to alleviation of requirement for linearity specifications for the output signal.

(4) In the operational amplifier, the output waveform is folded within the range of the reference voltages. Therefore, the operational amplifier can output the signal having the voltage amplitude which is larger than the power supply voltage, upon demodulation in the digital domain. Accordingly, the circuit can be remarkably improved in the output dynamic range.

(5) In the operational amplifier, the signal amplitude at the virtual ground point is compressed to (1/Gain) of the original signal amplitude. Therefore, the operational amplifier can receive the signal amplitude which is equal to or larger than the power supply voltage. Thus, the circuit does not require any level shift circuit or any attenuator in the circuit input part, and this leads to simplification of the circuit configuration.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A differential amplifier circuit comprising:
    an operational amplifier including a feedback capacitance, the operational amplifier amplifying an analog input signal and outputting an amplified analog output signal; and
    a modulator connected to a virtual ground point of an input terminal of the operational amplifier, the modulator switching between a pair of inputted analog differential signals to alternately select one of the analog differential signals based on a predetermined modulation control signal, and outputting a selected analog differential signal,
    wherein the differential amplifier circuit alternately folding and amplifying the analog input signal within a predetermined input level limit range to generate a signal having different polarities sequentially so as to start from a voltage potential of the virtual ground point at a timing of the modulation control signal.

2. An AD converter apparatus comprising a differential amplifier circuit,
    wherein the differential amplifier circuit comprises:
    an operational amplifier including a feedback capacitance, the operational amplifier amplifying an analog input signal and outputting an amplified analog output signal; and
    a modulator connected to a virtual ground point of an input terminal of the operational amplifier, the modulator switching between a pair of inputted analog differential signals to alternately select one of the analog differential signals based on a predetermined modulation control signal, and outputting a selected analog differential signal,
    wherein the differential amplifier circuit alternately folding and amplifying the analog input signal within a predetermined input level limit range to generate a signal having different polarities sequentially so as to start from a voltage potential of the virtual ground point at a timing of the modulation control signal,
    wherein the AD converter apparatus further comprises:
    an AD converter for AD-converting the analog output signal from the operational amplifier into a digital signal; and
    a digital demodulator for inverting a polarity of the digital signal from the AD converter at the timing of the modulation control signal, offsetting the polarity at the virtual ground point, and adding the digital signal to a signal level of a digital signal at a preceding timing to demodulate the digital signal corresponding to a signal level of the analog input signal.

3. The AD converter apparatus as claimed in claim 2,
    wherein each of the differential amplifier circuit and the AD converter is configured by a fully-differential circuit.

4. An AD converter apparatus comprising a differential amplifier circuit,
   wherein the differential amplifier circuit comprises:
   an operational amplifier including a feedback capacitance, the operational amplifier amplifying an analog input signal and outputting an amplified analog output signal; and
   a modulator connected to a virtual ground point of an input terminal of the operational amplifier, the modulator switching between a pair of inputted analog differential signals to alternately select one of the analog differential signals based on a predetermined modulation control signal, and outputting a selected analog differential signal,
   wherein the differential amplifier circuit alternately folding and amplifying the analog input signal within a predetermined input level limit range to generate a signal having different polarities sequentially so as to start from a voltage potential of the virtual ground point at a timing of the modulation control signal,
   wherein the AD converter apparatus further comprises:
   a comparator for comparing the analog output signal from the operational amplifier with a predetermined reference value and outputting a comparison result signal;
   a modulation controller for generating and outputting an AT conversion signal representing a timing of change in the comparison result signal from the comparator, outputting the AT conversion signal to the modulator as a modulation control signal, and generating and outputting a demodulation increasing and decreasing control signal that changes in accordance with increasing and decreasing of the analog input signal for demodulation of the analog input signal;
   a TD converter for converting the AT conversion signal from the modulation controller into a TD conversion signal, which is a digital signal, at a timing of a predetermined data clock; and
   a digital demodulator for demodulating the TD conversion signal from the TD converter into a digital AD conversion demodulation signal having a signal level corresponding to the analog input signal, using the data clock and the demodulation increasing and decreasing control signal.

5. The AD converter apparatus as claimed in claim 4,
   wherein the comparator compares the analog output signal from the operational amplifier with a predetermined maximum reference value and a predetermined minimum reference value and outputs a comparison result signal.

6. The AD converter apparatus as claimed in claim 5,
   wherein the comparator further compares the analog output signal from the operational amplifier with a plurality of reference values allocated between the maximum reference value and the minimum reference value, and outputs an intermediate comparison result signal between the maximum reference value and the minimum reference value,
   wherein the TD converter further converts the intermediate comparison result signal from the comparator into an intermediate comparison result signal, which is a digital signal, at the timing of the data clock, and
   wherein the digital demodulator demodulates the TD conversion signal from the TD converter into a digital AD conversion demodulation signal having a signal level corresponding to the analog input signal, using the data clock, the demodulation increasing and decreasing control signal, and the intermediate comparison result signal.

7. The AD converter apparatus as claimed in claim 6,
   wherein each of the differential amplifier circuit and the comparator is configured by a fully-differential circuit.

8. The AD converter apparatus as claimed in claim 5,
   wherein each of the differential amplifier circuit and the comparator is configured by a fully-differential circuit.

9. The AD converter apparatus as claimed in claim 4,
   wherein each of the differential amplifier circuit and the comparator is configured by a fully-differential circuit.

* * * * *